(12) United States Patent
Vermeer et al.

(10) Patent No.: US 9,273,392 B2
(45) Date of Patent: Mar. 1, 2016

(54) APPARATUS FOR ATOMIC LAYER DEPOSITION

(75) Inventors: Adrianus Johannes Petrus Maria Vermeer, Delft (NL); Joseph Adrianus Maria De Swart, Delft (NL); Robert Coenraad Wit, Delft (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 0 days.

(21) Appl. No.: 13/982,270

(22) PCT Filed: Jan. 30, 2012

(86) PCT No.: PCT/NL2012/050049
§ 371 (c)(1),
(2), (4) Date: Oct. 7, 2013

(87) PCT Pub. No.: WO2012/105831
PCT Pub. Date: Aug. 9, 2012

(65) Prior Publication Data
US 2014/0030445 A1 Jan. 30, 2014

(30) Foreign Application Priority Data

Jan. 31, 2011 (EP) ..................................... 11152792

(51) Int. Cl.
*C23C 16/44* (2006.01)
*C23C 16/455* (2006.01)
(Continued)

(52) U.S. Cl.
CPC ............... *C23C 16/44* (2013.01); *C23C 16/458* (2013.01); *C23C 16/4582* (2013.01);
(Continued)

(58) Field of Classification Search
CPC .. C23C 16/44; C23C 16/45551; C23C 16/54; C23C 16/445; C23C 16/458; C23C 16/4582; C23C 16/4583; F16C 32/0685; F16C 32/0603

USPC ................................................. 118/718, 715
See application file for complete search history.

(56) References Cited

U.S. PATENT DOCUMENTS 4,444,531 A 4/1984 Baker et al.
8,207,063 B2 * 6/2012 Cowdery-Corvan . C23C 16/407
438/149
(Continued)

FOREIGN PATENT DOCUMENTS

WO  WO 2011014070 A1 * 2/2011
WO  WO 2012105832 A1 * 8/2012

OTHER PUBLICATIONS

International Search Report for PCT/NL2012/050049, mailed Apr. 23, 2012 (2 pages).

*Primary Examiner* — Jeffrie R Lund
(74) *Attorney, Agent, or Firm* — Patterson Intellectual Property Law, P.C.; James R. Cartiglia

(57) ABSTRACT

Apparatus for atomic layer deposition on a surface of a sheeted substrate, comprising: an injector head comprising a deposition space provided with a precursor supply and a precursor drain; said supply and drain arranged for providing a precursor gas flow from the precursor supply via the deposition space to the precursor drain; the deposition space in use being bounded by the injector head and the substrate surface; a gas bearing comprising a bearing gas injector, arranged for injecting a bearing gas between the injector head and the substrate surface, the bearing gas thus forming a gas-bearing; a conveying system providing relative movement of the substrate and the injector head along a plane of the substrate to form a conveying plane along which the substrate is conveyed. A support part arranged opposite the injector head, the support part constructed to provide a gas bearing pressure arrangement that balances the injector head gas-bearing in the conveying plane, so that the substrate is held supportless by said gas bearing pressure arrangement in between the injector head and the support part.

11 Claims, 21 Drawing Sheets

(51) Int. Cl.
 *C23C 16/54* (2006.01)
 *C23C 16/458* (2006.01)
 *F16C 32/06* (2006.01)

(52) U.S. Cl.
 CPC ...... *C23C 16/4583* (2013.01); *C23C 16/45551* (2013.01); *C23C 16/54* (2013.01); *F16C 32/0603* (2013.01); *F16C 32/0685* (2013.01)

(56) References Cited

U.S. PATENT DOCUMENTS

| | | | |
|---|---|---|---|
| 8,956,456 B2 * | 2/2015 | Vermeer et al. | 118/719 |
| 2009/0017190 A1 * | 1/2009 | Sferlazzo et al. | 427/10 |
| 2009/0291209 A1 | 11/2009 | Granneman et al. | |
| 2011/0268879 A1 * | 11/2011 | Granneman | C23C 16/54 427/255.5 |
| 2012/0196050 A1 * | 8/2012 | Vermeer et al. | 427/535 |
| 2012/0291707 A1 * | 11/2012 | Granneman | 118/724 |
| 2013/0052347 A1 * | 2/2013 | Kuznetsov | C23C 14/568 427/248.1 |
| 2013/0199448 A1 * | 8/2013 | Granneman | B65G 51/03 118/729 |
| 2014/0030445 A1 * | 1/2014 | Vermeer et al. | 427/569 |
| 2014/0037847 A1 * | 2/2014 | Vermeer et al. | 427/255.28 |
| 2014/0044887 A1 * | 2/2014 | Vermeer | 427/535 |

* cited by examiner

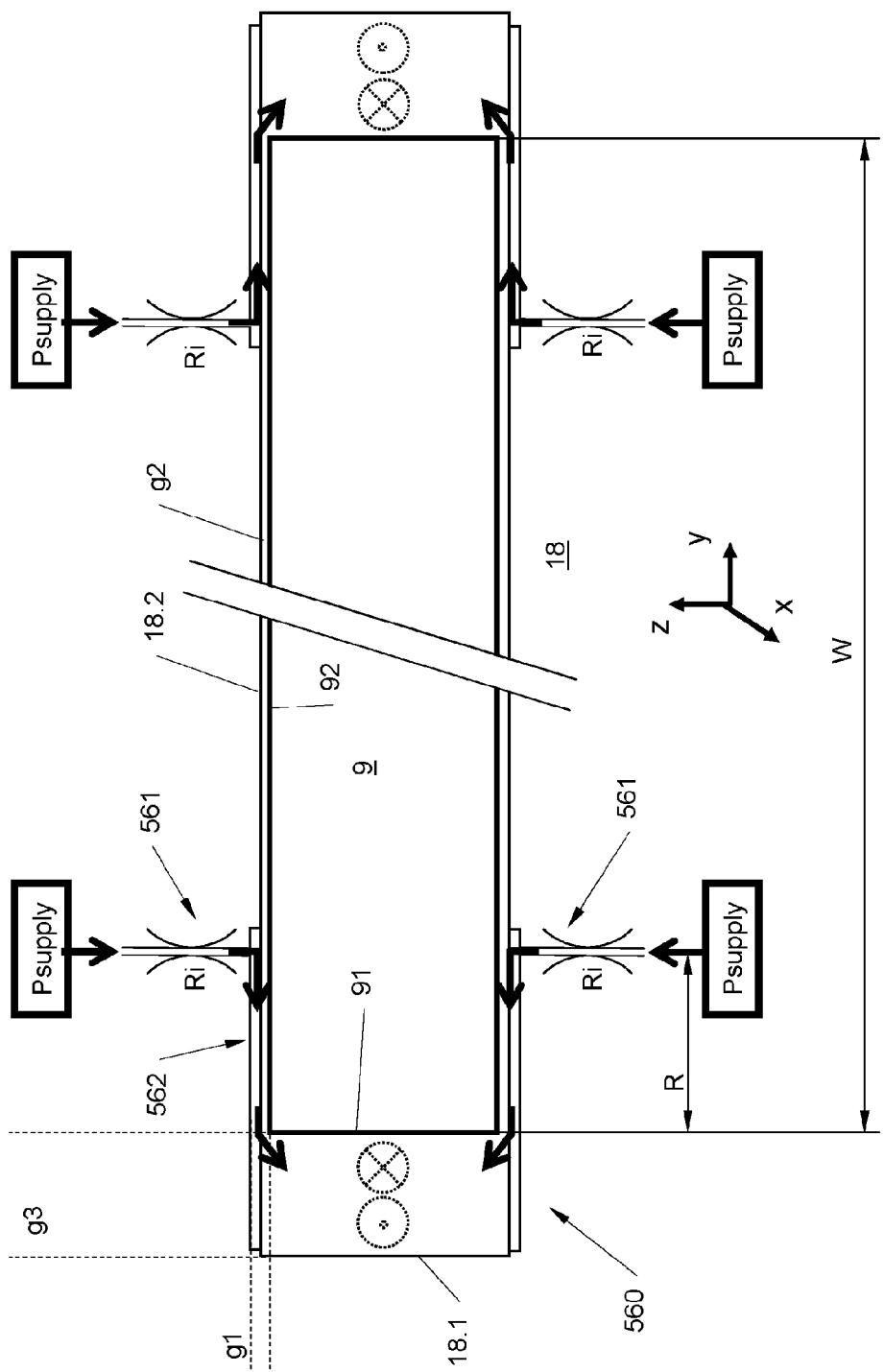

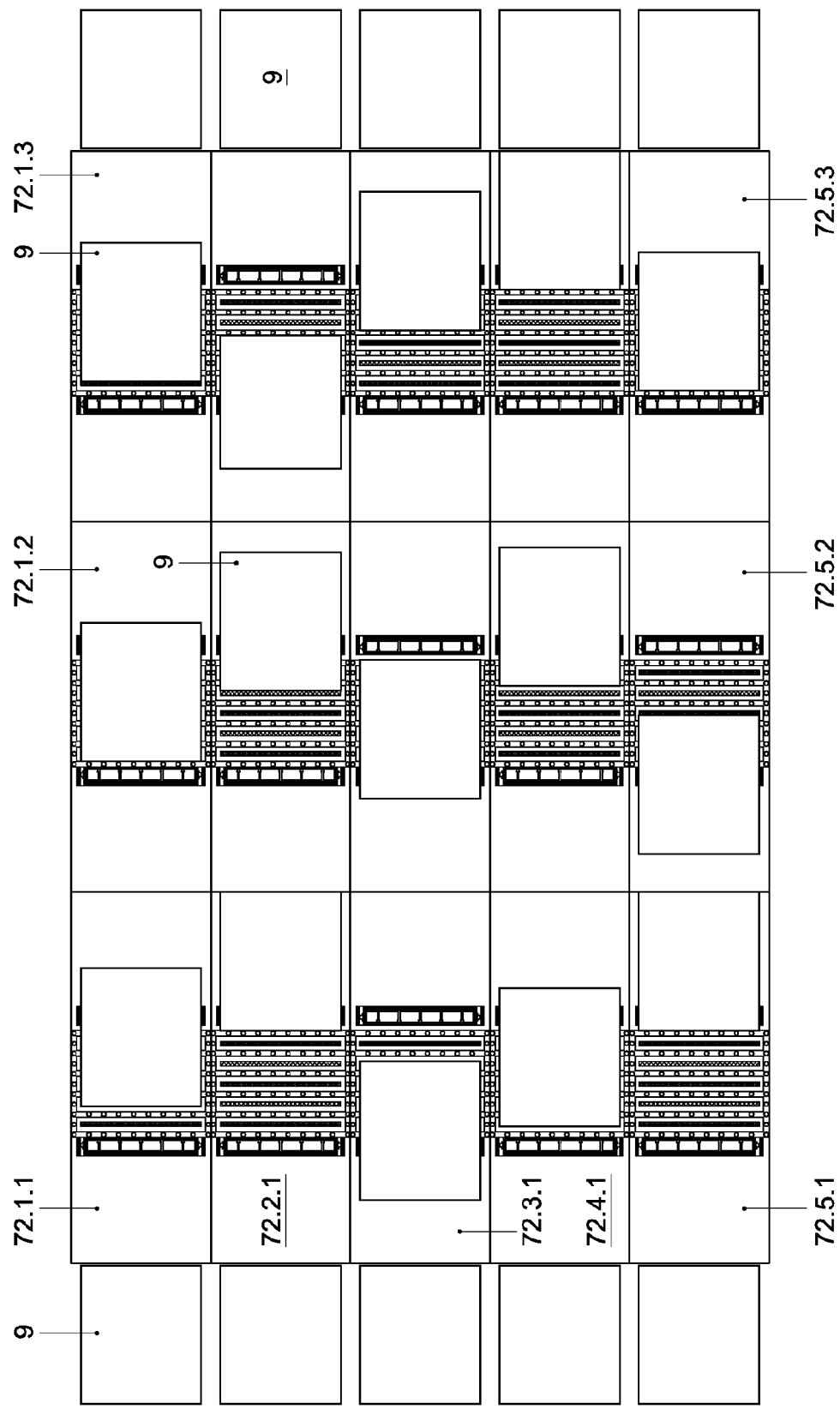

APPARATUS FOR ATOMIC LAYER DEPOSITION

FIELD OF THE INVENTION

The invention relates to an apparatus for atomic layer deposition on a surface of a substrate. The invention further relates to a method for atomic layer deposition on a surface of a substrate.

BACKGROUND

Atomic layer deposition is known as a method for (repeated) depositing of a monolayer of target material. Atomic layer deposition differs from for example chemical vapour deposition in that atomic layer deposition takes at least two process steps. A first one of these process steps comprises application of a precursor gas on the substrate surface. A second one of these process steps comprises reaction of the precursor material in order to form the monolayer of target material. Atomic layer deposition has the advantage of enabling a good layer thickness control.

WO2008/085474 discloses an apparatus for deposition of atom layers. The apparatus discloses an air bearing effect so that a substrate hovers above an injector head. For sheeted substrates, such hovering may be an inefficient way to use precursor gas, where a risk of contamination is present and layers may be deposited less accurately.

US2009/081885 discloses an atomic layer deposition system having a substrate transported via a gas fluid bearing.

A challenge exists in guidance of the substrate while stabilizing lateral movements of the substrate.

SUMMARY

Accordingly, it is an object, according to an aspect of the invention to provide an apparatus and method for atomic layer deposition with improved use of the precursor gas; wherein the substrate support is provided accurately. According to an aspect, the invention provides an apparatus for atomic layer deposition on a surface of a sheeted substrate, comprising: an injector head comprising a deposition space provided with a precursor supply and a precursor drain; said supply and drain arranged for providing a precursor gas flow from the precursor supply via the deposition space to the precursor drain; the deposition space in use being bounded by the injector head and the substrate surface; a gas bearing comprising a bearing gas injector, arranged for injecting a bearing gas between the injector head and the substrate surface, the bearing gas thus forming a gas-bearing; and a conveying system providing relative movement of the substrate and the injector head along a plane of the substrate to form a conveying plane along which the substrate is conveyed. A support part is arranged opposite the injector head, the support part constructed to provide a gas bearing pressure arrangement that counters the injector head gas-bearing pressure in the conveying plane, so that the substrate is balanced supportless by said gas bearing pressure arrangement in between the injector head and the support part. A conveying system is provided comprising a drive section. The drive section comprises transport elements arranged to provide relative movement of the substrate and the injector head along a plane of the substrate to form a conveying plane along which the substrate is conveyed.

The deposition space may define a deposition space height $D2$ relative to a substrate surface. The gas bearing defines, relative to a substrate, a gap distance $D1$ which is smaller than the deposition space height $D2$.

According to another aspect, the invention provides a method for atomic layer deposition on a surface of a substrate using an apparatus including an injector head, the injector head comprising a deposition space provided with a precursor supply and a gas bearing provided with a bearing gas injector, wherein the deposition space defines a deposition space height $D2$ relative to the substrate surface; and wherein the gas bearing defines, relative to the substrate, a gap distance $D1$ which is smaller than the deposition space height $D2$, the method comprising the steps of: supplying a precursor gas from the precursor supply into the deposition space for contacting the substrate surface; injecting a bearing gas between the injector head and the substrate surface, the bearing gas thus forming a gas-bearing; establishing relative motion between the deposition space and the substrate in a plane of the substrate surface; and providing a gas bearing pressure arrangement that counters the injector head gas-bearing pressure in the conveying plane, so that the substrate is balanced supportless by said gas bearing pressure arrangement in between the injector head and the support part. Such a method may, optionally, be carried out by using an apparatus according to the invention.

By the balanced air bearing support, the sheeted substrate can be controlled to be held in the conveying plane, without mechanically compromising the substrate. In addition, through the use of the air bearings, independent pressure control of the deposition space can be provided, thus enabling freedom of choice for a number of deposition materials and methods.

Confining the precursor gas to the deposition space enables control of a pressure in the deposition space, for example a precursor gas pressure in the deposition space or a total pressure in the deposition space. Thereto the apparatus may include a deposition space pressure controller. The pressure in the deposition space may be controlled to be independent of, and/or different from, a pressure outside the deposition space. In this way, a predetermined pressure in the deposition space can be set, preferably dedicated to optimizing the atomic-layer deposition process.

In use of the apparatus, the deposition space is bounded by the substrate surface. It may be clear that in this way the substrate helps confining the precursor gas. Such confining by the substrate may ensure that precursor gas flow through the imaginary plane along the substrate surface is substantially prevented. However, this is not necessary and it is even possible to support substrates that are punctured to a variety of extents, as long as sufficient bearing surface can be provided for providing bearing gas support.

A combination of relative motion between the deposition space and the substrate in the plane of the substrate surface, and confining the injected precursor gas to the deposition space, further enables a rather efficient use of the precursor gas. In this way, a volume of the precursor gas can be distributed efficiently over the substrate surface, thus enhancing a probability of a precursor gas molecule to attach to the substrate surface after it is injected in the deposition space.

BRIEF DESCRIPTION OF THE DRAWINGS

The invention will now be described, in a non-limiting way, with reference to the accompanying drawings, in which:

FIG. 9C shows an alternative embodiment for a centering air bearing

FIG. 10 shows a schematic view of a plurality of apparatuses.

Unless stated otherwise, the same reference numbers refer to like components throughout the drawings.

DETAILED DESCRIPTION

Figure 1:
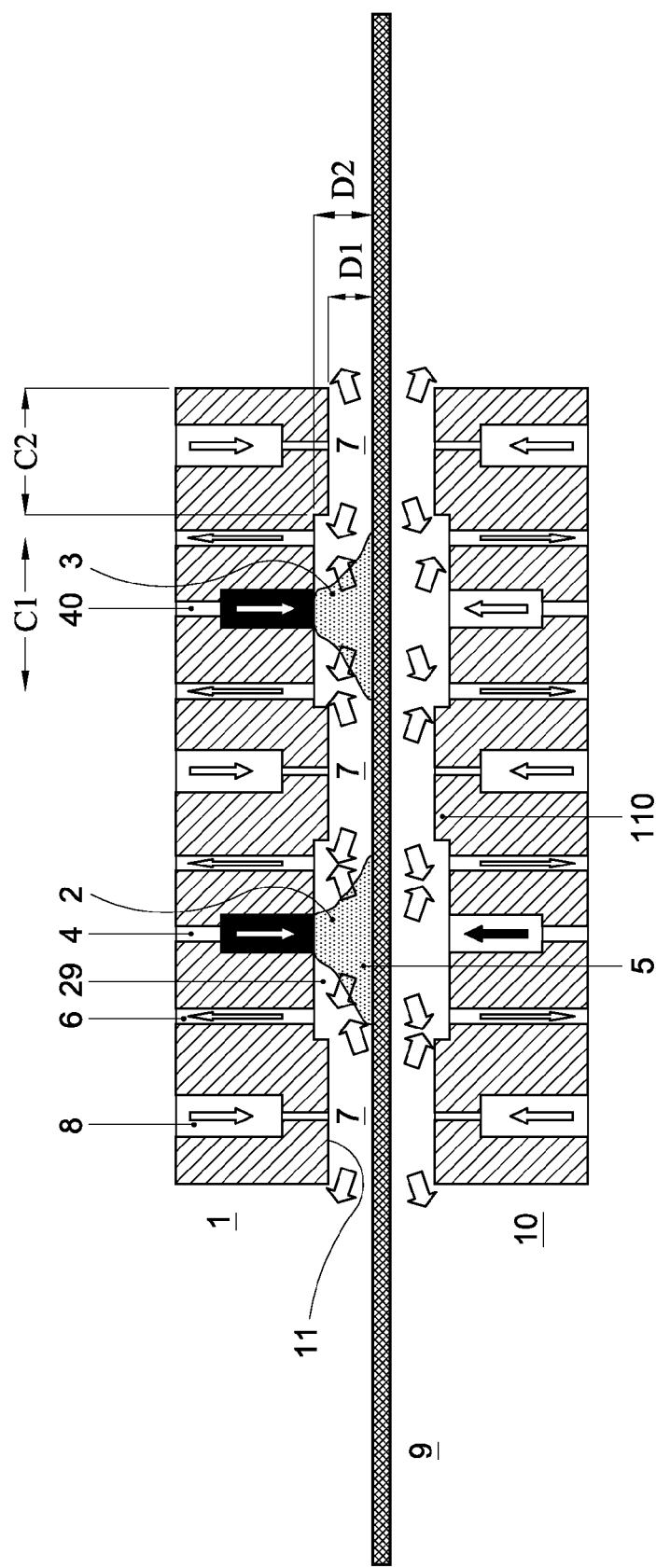
FIG. 1 shows a schematic side view of an embodiment according to the invention

FIG. 1 shows a schematic side view of an embodiment according to the invention. As an example, an injector head 1 is shown having two deposition spaces 2, 3 separated by a gas bearing region. While for atomic layer in principle, at least two process steps are needed, only one of the process steps may need involvement of material deposition. Such material deposition may be carried out in a deposition space 2 provided with a precursor supply 4. Accordingly, in this embodiment it is shown that injector head comprises a further deposition space 3 provided with a reactant supply 40, the further deposition space 3 in use being bounded by the gas bearing 7. Alternatively or additionally, at least one of a reactant gas, a plasma, laser-generated radiation, and ultraviolet radiation, may be provided in the reaction space for reacting the precursor with the reactant gas after deposition of the precursor gas on at least part of the substrate surface in order to obtain the atomic layer on the at least part of the substrate surface. By suitable purging of spaces 2, and 3, the supplies 4 and 40 may be switched during processing. This can be done precisely timed in a manner that the precursor gas only flows into the deposition space while the wafer is present at the position of the deposition space. This will prevent costly precursor gas flowing to the exhaust without use, while the wafer is outside the deposition space, thus further enhancing the precursor gas use efficiency.

The precursor and reactant supplies 4, 40 are preferably designed without substantial flow restrictions to allow for plasma deposition. Thus, towards a substrate surface 5, plasma flow is unhindered by any flow restrictions.

In this embodiment, a precursor gas is circulated in the deposition space 2 by a flow alongside the substrate surface 5. The gas flow is provided from the precursor supply 4 via the deposition space to the precursor drain 6. In use the deposition space 2 is bounded by the injector head 1 and the substrate surface 5. Gas bearings 7 are provided with a bearing gas injector 8 arranged adjacent the deposition space, for injecting a bearing gas between the injector head 1 and the substrate surface 5, the bearing gas thus forming a gas-bearing while confining the injected precursor gas to the deposition space 2. The precursor drain 6 may additionally function to drain bearing gas preventing flow of bearing gas into the deposition space 2, 3.

While in the embodiment each gas bearing 7 is shown to be dimensioned as a flow barrier, in principle, this is not necessary; for example, a flow barrier separating the deposition spaces 2, 3 need not be dimensioned as a gas bearing as long as an effective flow barrier is provided. Typically, a flow barrier may have a gap height that is larger than a gap height wherein a gas bearing is effective. In practical examples, the gas bearing operates in gap height ranges from 5 um-100 um; wherein a flow barrier may still be effective above such values, for example, until 500 um. Also, gas bearings 7 may only be effective as flow barrier (or gas bearing for that matter) in the presence of substrate 9; while flow barriers may or may not be designed to be active irrespective of the presence of substrate 9. Importantly, flow of active materials between deposition spaces 2, 3 is prevented by flow barriers at any time to avoid contamination. These flow barriers may or may not be designed as gas bearings 7.

While FIG. 1 not specifically shows a conveying system (see more detail in FIG. 3), the substrate 9 is moved relative to the injector head 2, to receive subsequent deposition of materials from deposition spaces 2 and 3. By reciprocating motion of the substrate 9 relative to the injector head 1, the number of layers can be controlled.

Importantly, a support part 10 is provided that provides a support for substrate 9 along a conveying plane which may be seen as the centre line of substrate 9. The support part 10 is arranged opposite the injector head and is constructed to provide a gas bearing pressure arrangement that balances the injector head gas-bearing 7 in the conveying plane. Although less then perfect symmetrical arrangements may be feasible to provide the effect, preferably, the balancing is provided by having an identical flow arrangement in the support part as is provided by the injector head 1. Thus, preferably, each flow ejecting nozzle of the support part 10 is symmetrically positioned towards a corresponding nozzle of the injector head 1. In this way, the substrate can be held supportless, that is, without a mechanical support, by said gas bearing pressure arrangement in between the injector head 1 and the support part 10. More in general, a variation in position, along the conveying plane, of flow arrangements in the injector head 1 and in the support part 10, that is smaller than 0.5 mm, in particular smaller than 0.2 mm, may still be regarded as an identical flow arrangement. By absence of any mechanical support, a risk of contamination of such support is prevented which is very effective in securing optimal working height of the injector head 1 relative to the substrate 9. In addition, less down time of the system is necessary for cleaning purposes. Furthermore, importantly, by absence of a mechanical support, a heat capacity of the system can be reduced, resulting in faster heating response of substrates to production temperatures, which may significantly increase production throughput and reduce power consumption.

In this respect, the deposition space defines a deposition space height D2 relative to a substrate surface; and wherein the gas bearing 7, functioning as flow barrier, comprises a flow restricting surface 11 facing a substrate surface 5, defining, relative to a substrate, a gap distance D1 which is smaller than the deposition space height D2. The deposition space is provided with a precursor supply 4 and a precursor drain 6. Said supply and drain may be arranged for providing a precursor gas flow from the precursor supply via the deposition space to the precursor drain. In use, the deposition space is bounded by the injector head 1 and the substrate surface. The deposition space may be formed by a cavity 29, having a depth D2-D1, in which the supply and drain end and/or begin. Thus, more in general, the cavity is defined in the deposition head 1 and is, in use, facing the substrate 9. By having the cavity 29 facing the substrate, it is understood that the substrate is substantially forming a closure for the cavity, so that a closed environment is formed for supplying the precursor gas. In addition, the substrate may be provided such that various adjacent parts of the substrate or even adjacent substrates or other parts may be forming such closure. The apparatus may be arranged for draining the precursor gas by means of the precursor drain 6 of the deposition head 1 from the cavity for substantially preventing precursor gas to escape from the cavity. It may be clear that the bearing supply may be positioned at a distance from the cavity. The cavity may enable to apply process conditions in the cavity that are different from process conditions in the gas-bearing layer. Preferably, the precursor supply 4 and/or the precursor drain 6 are positioned in the cavity.

The depth D2-D1 of the cavity 29 may be defined as a local increase in distance between the substrate 9 and an output face of the injector head provided with the bearing gas injector 8 and the precursor supply. The depth D2 minus D1 may be in a range from 10 to 500 micrometers, more preferably in a range from 10 to 100 micrometers.

The flow restricting surface 11 may be formed by projecting portions 110 including bearing gas injector 8. The gas-bearing layer in use is for example formed between the surface 5 and the flow restricting surface 11. A distance C1 between the precursor drains 30 may typically be in a range from 1 to 10 millimeter, which is also a typical width of the deposition space 2, 3. A typical thickness of the gas-bearing layer, indicated by D1, may be in a range from 3 to 15 micrometer. To accommodate for various surface flatness qualities, however, the bearing gap may larger than 15 micrometer, for example, extended to larger dimensions, for example, up to 70 micrometer. A typical width C2 of the projecting portion 110 may be in a range from 1 to 30 millimeter. A typical thickness D2 of the deposition space 2 out of the plane of the substrate 9 may be in a range from 3 to 300 micrometer.

This enables more efficient process settings. As a result, for example, a volumetric precursor flow rate injected from the supply 4 into the deposition space 2 can be higher than a volumetric flow rate of the bearing gas in the gas-bearing layer, while a pressure needed for the injecting of the precursor gas can be smaller than a pressure needed for injecting the bearing gas in the gas-bearing layer. It will thus be appreciated that the thickness $D_1$ of the gas-bearing layer 7 may in general be less than a thickness $D_2$ of the deposition space 2, measured in a plane out of the substrate surface.

At a typical flow rate of $5 \cdot 10^{-4}$-$2 \cdot 10^{-3}$ m$^3$/s per meter channel width and a typical distance of L=5 mm, e.g. being equal to a distance from the precursor supply to the precursor drain, the channel thickness $D_c$, e.g. the thickness D2 of the deposition space 2, should preferably be larger than 25-40 μm. However, the gas-bearing functionality preferably requires much smaller distances from the precursor injector head to the substrate, typically of the order of 5 μm, in order to meet the important demands with respect to stiffness and gas separation and in order to minimize the amount of bearing gas required. The thickness $D_2$ in the deposition space 2 being 5 μm however, with the above-mentioned process conditions, may lead to unacceptably high pressure drops of ~20 bar. Thus, a design of the apparatus with different thicknesses for the gas-bearing layer (i.e. the thickness $D_1$) and deposition space (i.e. the thickness $D_2$) is preferably required. For flat substrates, e.g. wafers—or wafers containing large amounts of low aspect ratio (i.e. shallow) trenches 8 having an aspect ratio A (trench depth divided by trench width)≤10—the process speed depends on the precursor flow rate (in kg/s): the higher the precursor flow rate, the shorter the saturation time.

For wafers containing large amounts of high aspect ratio (i.e. deep narrow) trenches of A≥50, the process speed may depend on the precursor flow rate and on the precursor partial pressure. In both cases, the process speed may be substantially independent of the total pressure in the deposition space 2. Although the process speed may be (almost) independent of total pressure in the deposition space 2, a total pressure in the deposition space 2 close to atmospheric pressure may be beneficial for several reasons:

1. At sub-atmospheric pressures, the gas velocity $v_g$ in the deposition space 2 is desired to increase, resulting in an undesirably high pressure drop along the deposition space 2.
2. At lower pressures, the increase in the gas velocity $v_g$ leads to a shorter gas residence time in the deposition space 2, which has a negative effect on yield.
3. At lower pressures, suppression of precursor leakage from the deposition space 2 through the gas-bearing layer may be less effective.
4. At lower pressures, expensive vacuum pumps may be required.

The lower limit of the gas velocity $v_g$ in the deposition space 2 may be determined by the substrate traverse speed $v_s$: in general, in order to prevent asymmetrical flow behaviour in the deposition space 2, the following condition should preferably be satisfied:

$$V_g \geq \geq V_s$$

This condition provides a preferred upper limit of the thickness D, $D_2$ of the reaction space 3. By meeting at least one, and preferably all, of the requirements mentioned above, an ALD deposition system is obtained for fast continuous ALD on flat wafers and for wafers containing large amounts of high aspect ratio trenches.

Accordingly, in use, the total gas pressure in the deposition space 2 may be different from a total gas pressure in the additional deposition space 3. The total gas pressure in the deposition space 2 and/or the total gas pressure in the additional deposition space 3 may be in a range from 0.2 to 3 bar, for example 0.5 bar or 2 bar or even as low as 10 mBar, in particular, in a range of 0.01 bar to 3 bar. Such pressure values may be chosen based on properties of the precursor, for example a volatility of the precursor. In addition, the apparatus may be arranged for balancing the bearing gas pressure and the total gas pressure in the deposition space, in order to minimize flow of precursor gas out of the deposition space.

Figure 2:
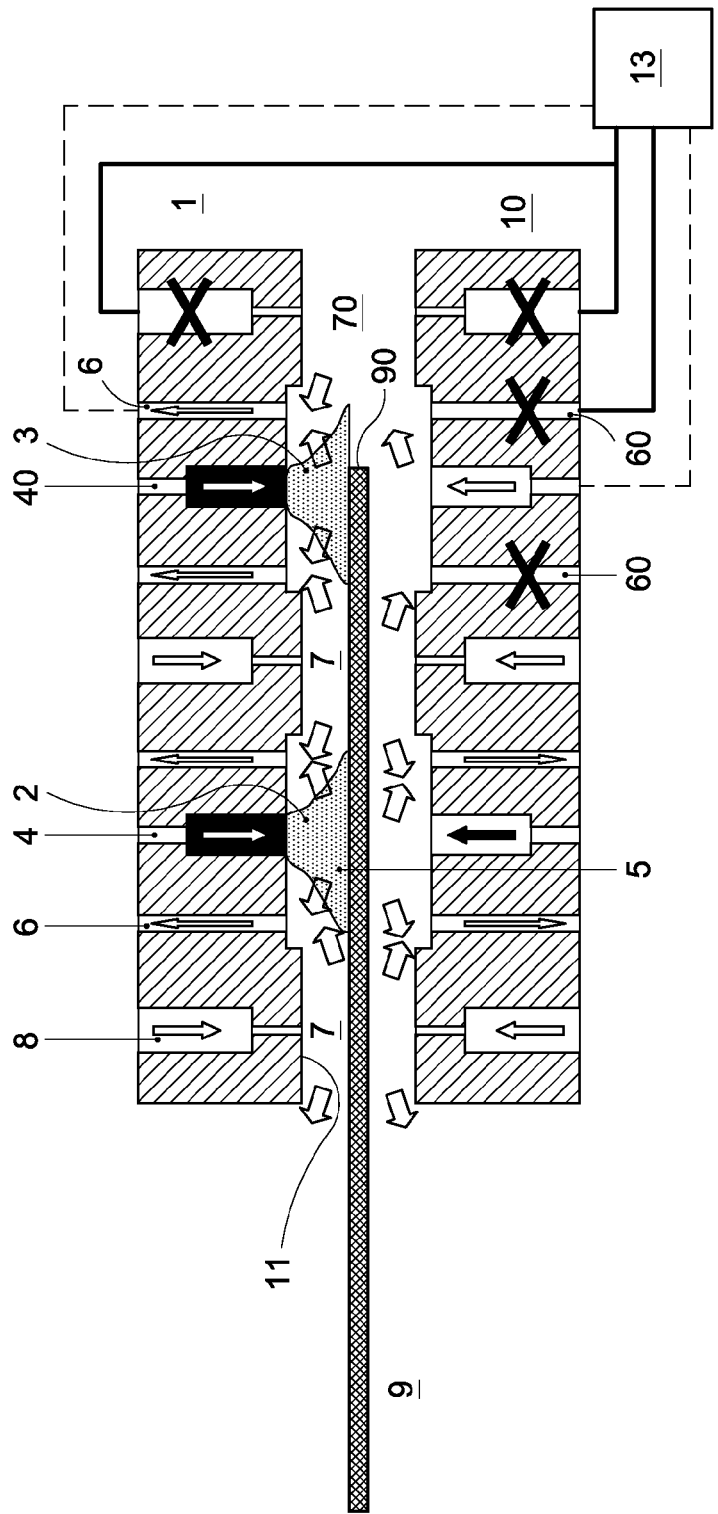
FIG. 2 shows a schematic side view of an embodiment according to the invention.

FIG. 2 shows schematically a switching configuration for a situation wherein a substrate edge 90 passes a number of nozzles in the injector head 1. According to a preferred embodiment, the injector head 1 comprises pressure control 13 for switching any of the precursor supply 4; drain 6 and/or the gas injector 8 dependent on the presence of a substrate 9. For the sake of clarity, only a few switching lines are illustrated. To level a bearing gas pressure, bearing gas lines of opposed bearing gas injectors 8 may be coupled to provide an equalized bearing gas pressure. As schematically shown by X marks in FIG. 2, the bearing gas pressure of outer nozzles 70 may be switched off. Conveniently precursor supply 4 may also be switched off when the substrate exits deposition space 3. Preferably, just prior to switching off precursor supply 4, drain 60 opposite a precursor drain 6 is switched off, said drain 60 being switchable dependent on the presence of a substrate 9 in the deposition space, so that, when a substrate edge 90 passes the precursor drain, a precursor flow is provided away from the substrate surface facing the support part.

Pressure controller 13 may control a deposition space pressure for controlling the pressure in the deposition space 2. In addition, the controller 13 controls gas-bearing layer pressure in the gas-bearing layer 7.

Accordingly, a method is shown wherein a gas flow 7 is provided arranged to provide a gas bearing pressure, wherein the gas flow may be switched dependent on the presence of a substrate 9, so that, when a substrate edge 90 passes a drain 60, the drain is selectively switched off so to provide a flow away from the substrate 9.

Figure 3:
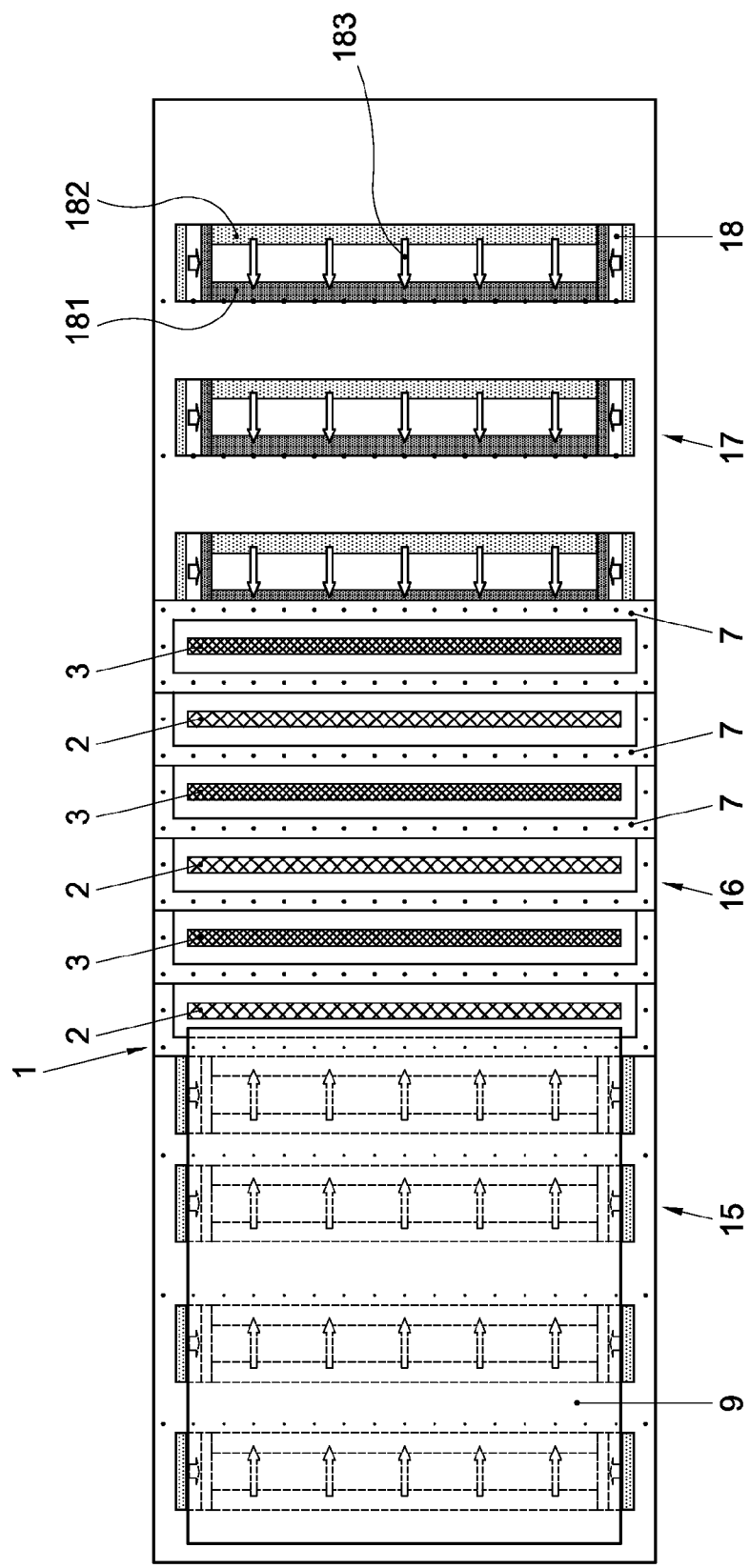
FIG. 3 shows a schematic plan view of another embodiment

FIG. 3 shows a schematic plan view of another embodiment. Here the injector head 1 is schematically depicted in plan view. The injector head 1 comprises alternating slits of deposition spaces 2, 3, for precursors and reactants respectively, each bounded by gas bearings/flow barriers 7. The substrate is seen to be carried into working zone 16 where injector head 1 is active, from a lead in zone 15. The working zone 16 is adjacent the lead in zone 15 and is aligned relative to the conveying plane, so that the substrate can be easily conveyed between these zones 15, 16. An additional lead out zone 17 may be provided. Depending on process steps, lead in and lead out can be interchanged or alternated. Thus, a substrate 9 can be moved reciprocatingly along a center line between the two zones 15, 17 through working zone 16.

In the shown embodiment the conveying system is provided with pairs of gas inlets 181 and outlets 182 facing the conveying plane and providing a flow 183 along the conveying plane from the outlet 182 towards the inlet 181. For clarity reasons only one pair is referenced in the figure. A gas flow control system is arranged to provide a gas bearing pressure and a gas flow 183 along the conveying plane, to provide movement of the substrate 9 along the conveying plane along a center line through the working zone 16 by controlling the gas flow.

Figure 4:
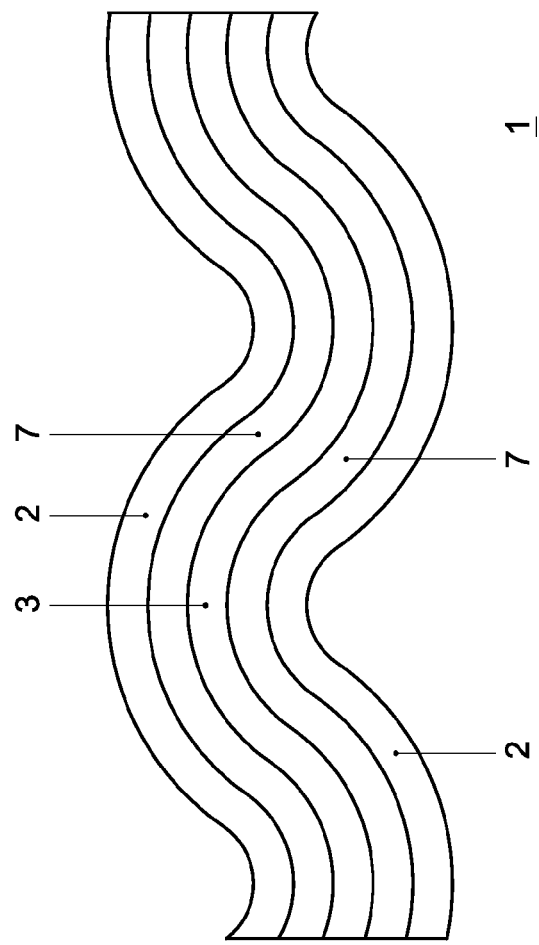
FIG. 4 shows an embodiment of an injector head according to another embodiment of the invention.

FIG. 4 shows a schematic example of an undulate shape for the injector head 1 seen in a direction normal to the substrate surface. Typically, the curved shape prevents first order bending modes of the substrate. Accordingly, it can be seen that the gas bearing 7 is formed, seen in a direction normal to the substrate surface, as undulated shapes to prevent first order bending modes of the sheet substrate. In addition, typically, the shape of deposition spaces 2, 3 may follow the shape of the gas bearing slits 7 to allow for compact injector head construction. These variations allow for optimization of a pressure distribution on the substrate surface. Such optimization can be important for fragile or flexible substrates.

Figure 5:
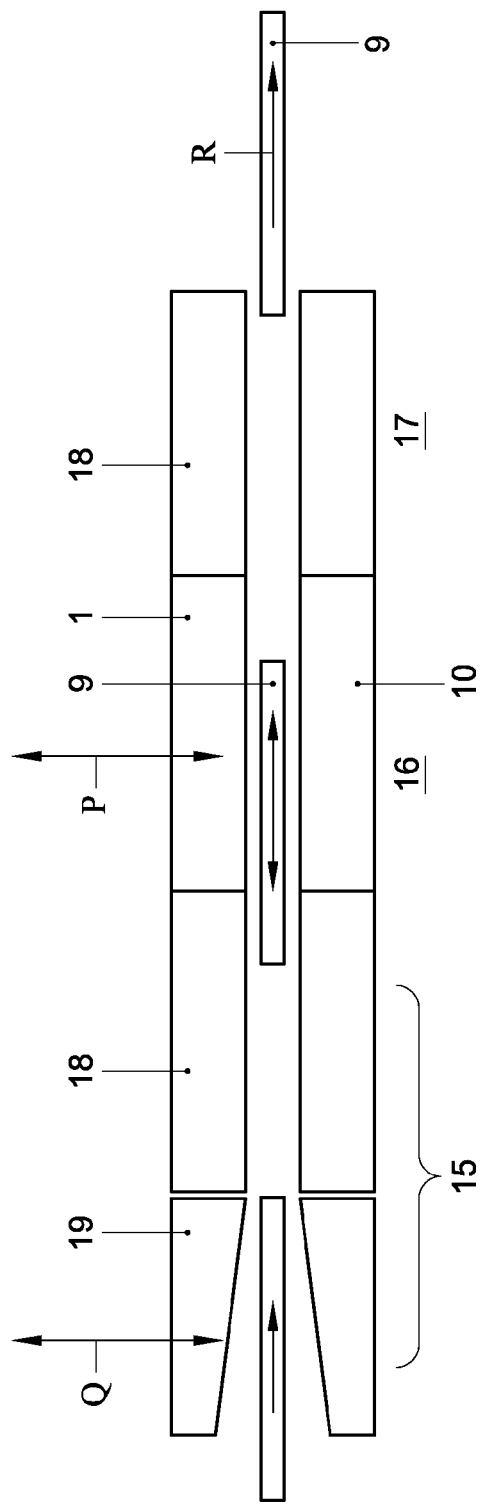
FIG. 5 shows a schematic side view of a fourth embodiment.

FIG. 5 shows a schematic side view of a fourth embodiment. Reference is made to the previous figures. In particular, a lead in zone 15 is shown, a working zone 16 and a lead out zone 17. The working zone is formed by injector head 1 and support 10. In the lead in and lead out zone, transport elements or drive sections 18 are provided for providing a transport of the substrate 9 along a conveying plane, indicated by direction R. According to an embodiment, the lead in zone 15 comprises slanted wall parts 19 facing the conveying plane. The drive section 18 comprises transport elements (see FIG. 7A) arranged to provide relative movement of the substrate and the injector head along a plane of the substrate to form a conveying plane along which the substrate is conveyed. The lead in zone 15 comprises slanted wall parts symmetrically arranged relative to the conveying plane coinciding with substrate 9. The slanted wall parts 19 are formed and constructed to reduce a working height Dx from about 100-200 micron above the substrate 9 in a first conveying direction P towards the drive section 18 to a reduced working height of ranging from 30-100 micron, preferably about 50 micron, forming the smallest gap distance Dy.

Figure 6:
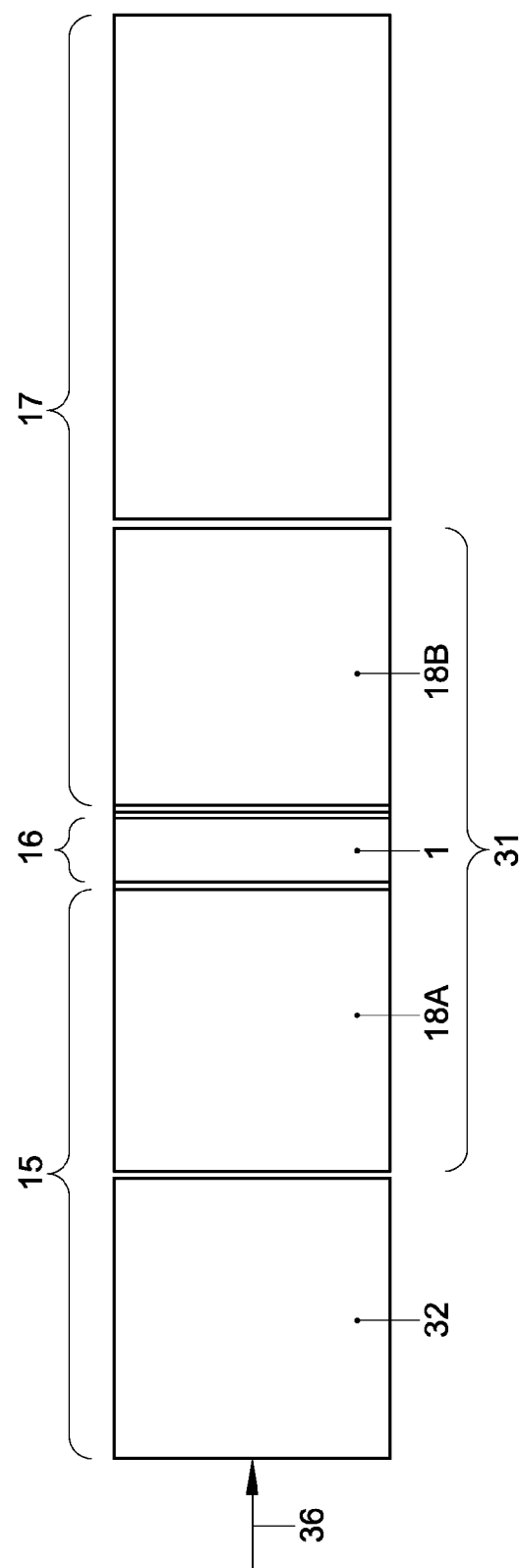
FIG. 6 shows a schematic view of a variant of the fourth embodiment.

FIG. 6 shows a schematic view of an apparatus for atomic layer deposition on a surface of a sheeted substrate in a variant of the fourth embodiment, further referred to as a fifth embodiment. FIG. 6 coincides with a top view of the fourth embodiment depicted in FIG. 5. The sheeted substrate 9 may be flexible or rigid, e.g. may be a foil or a wafer. The apparatus may comprise the injector head 1 and the conveying system for providing relative movement of the substrate 9 and the injector head 1 along a plane of the substrate 9 to form a conveying plane along which the substrate 9 is conveyed.

The conveying system may comprises the lead in zone 15, and the working zone 16 adjacent the lead in zone 15 and aligned relative to the conveying plane. The injector head 1 is provided in the working zone 16. The sheeted substrate (not shown in FIG. 6 but shown in FIG. 5 with reference number 9) can be inserted in the lead in zone 15. The lead out zone 17 is provided adjacent to the working zone 16. Hence, the working zone 16 may be located in between the lead in zone 15 and the lead out zone 17. In the lead in zone a first transport element or drive section 18A may be provided and in the lead out zone a second transport element or drive section 18B may be provided. The first drive section 18A and the second drive section 18B may be arranged as further detailed in FIGS. 7a-f for moving the substrate reciprocatingly, via a controlled gas flow, between the lead in zone 15 and the lead out zone 17 through the working zone 16. Thus, the first drive section 18A, the working zone 16, and the second drive section 18B may together form a process zone 31 wherein the substrate 9 may be reprocatingly moved during deposition of the atomic layers by controlling the gas flow in the drive sections.

Reception element 32 facilitates introduction of the substrate 9 into the first transport element 18A.

Figure 7A:
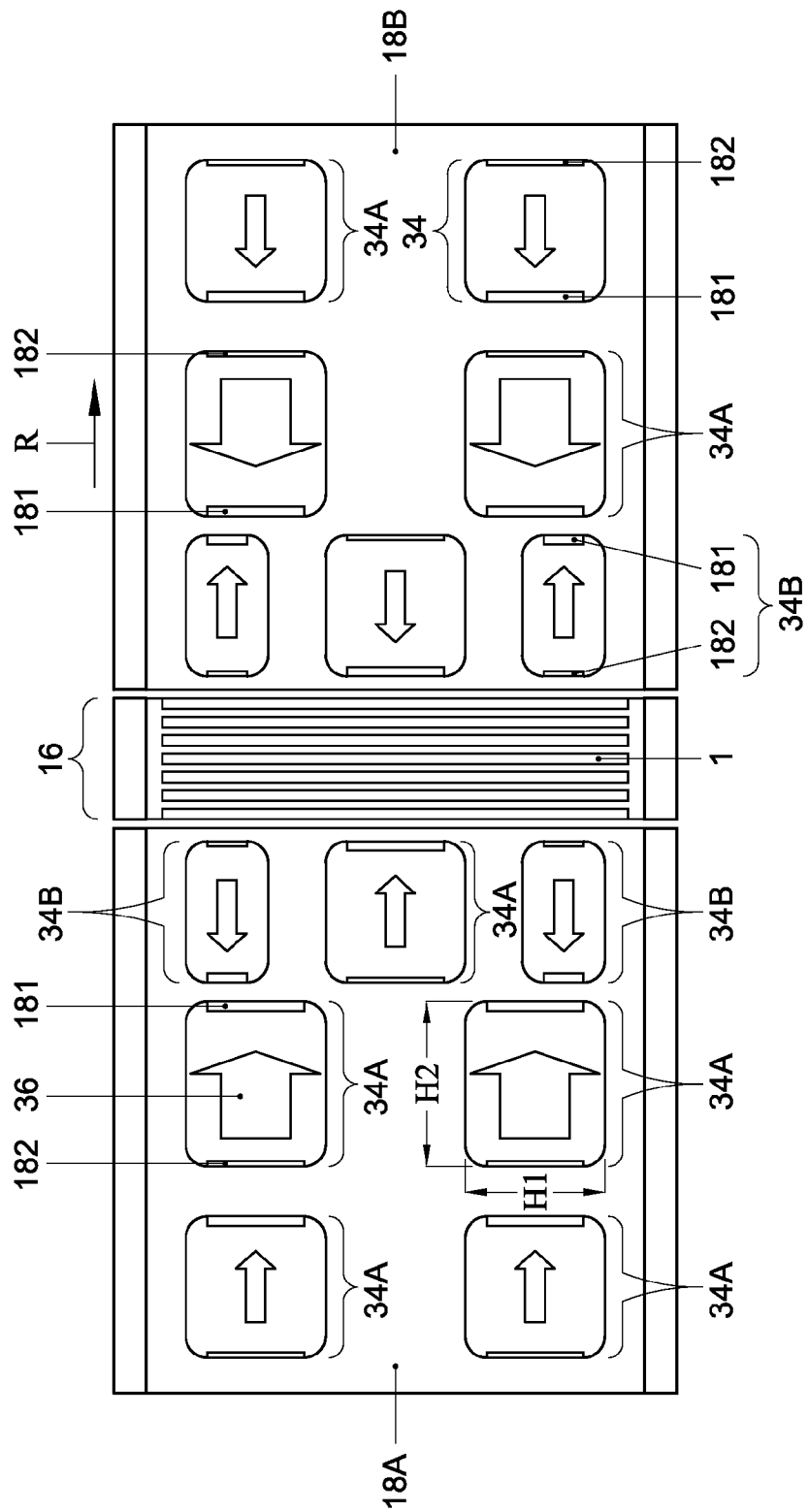
FIG. 7A shows a top view of a first transport element, a second transport element, and a working zone with an injector head.
Figure 7B:
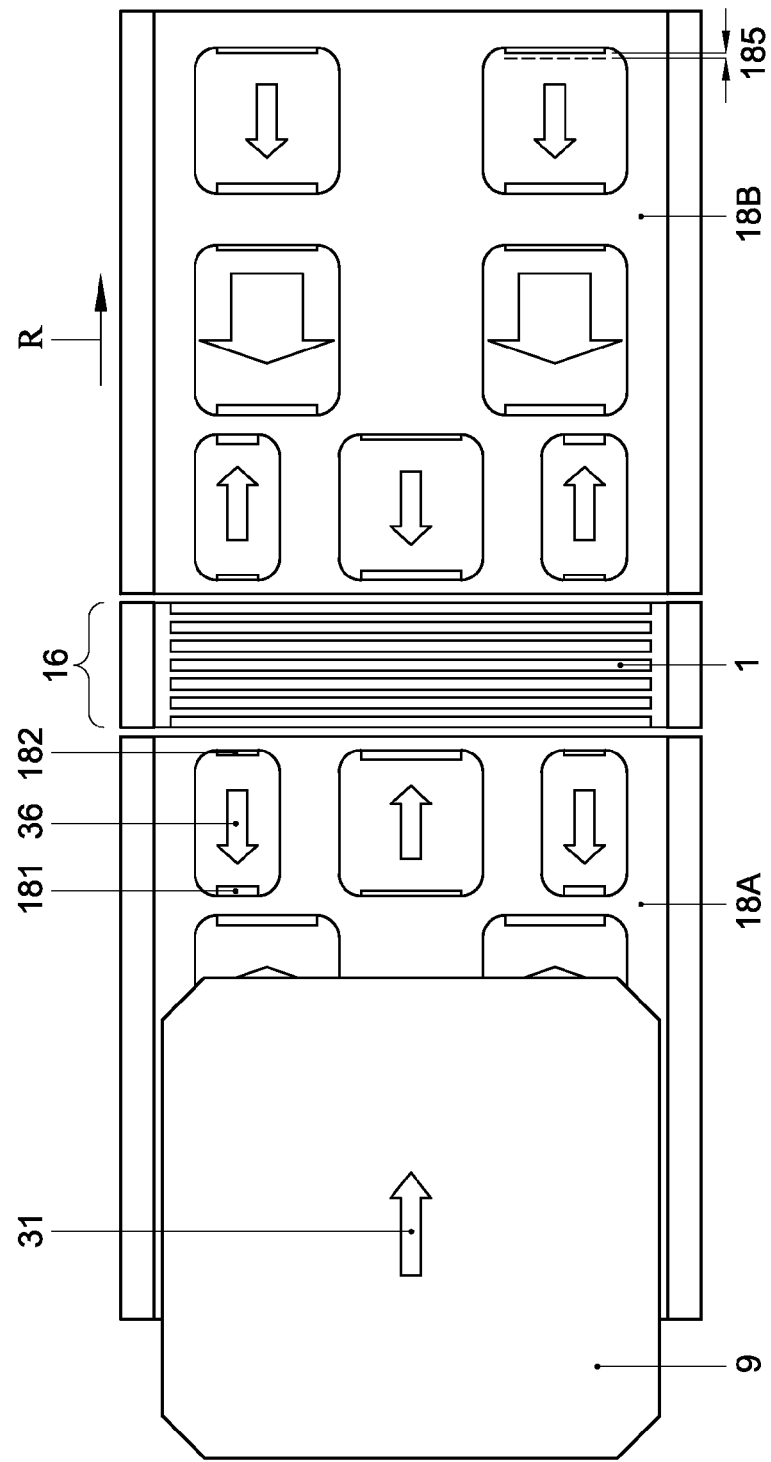
FIG. 7B shows a substrate being transported in a lead in zone.
Figure 7C:
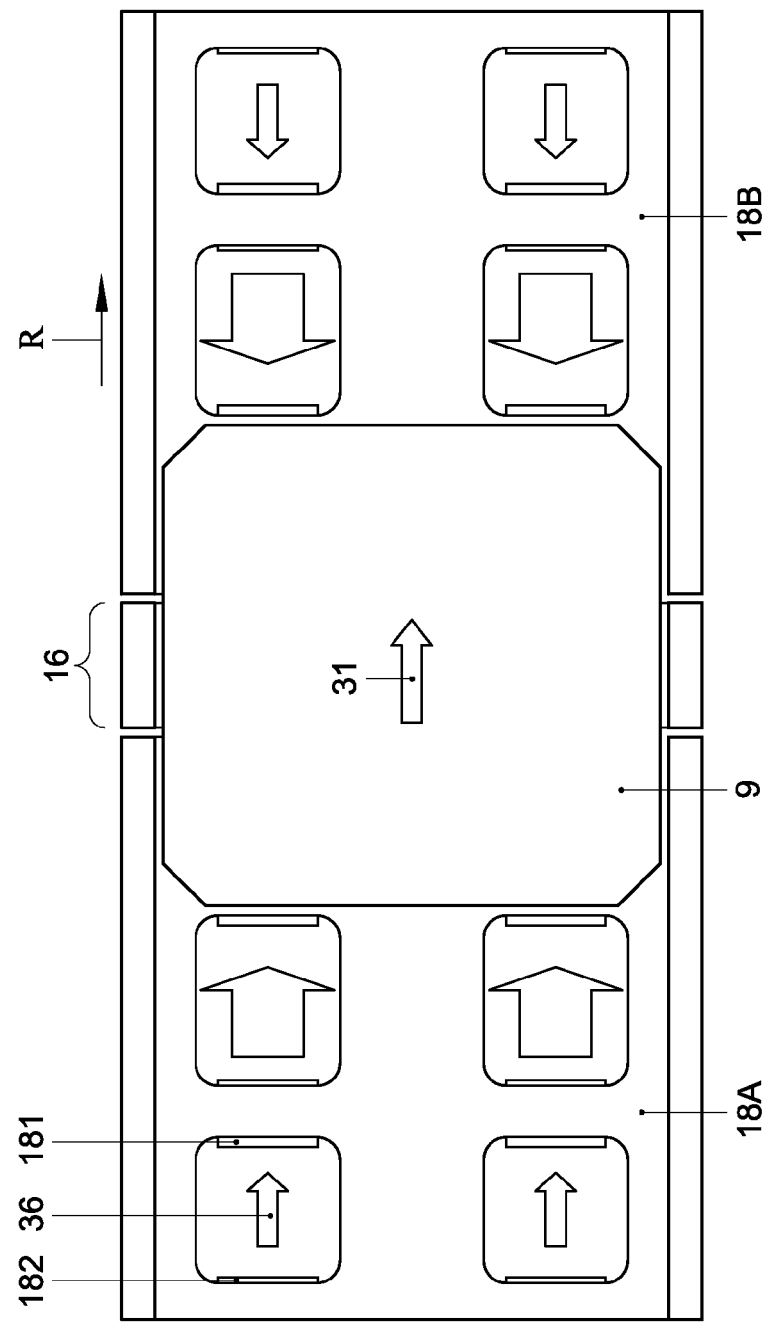
FIG. 7C shows the substrate being transported through a working zone.
Figure 7D:
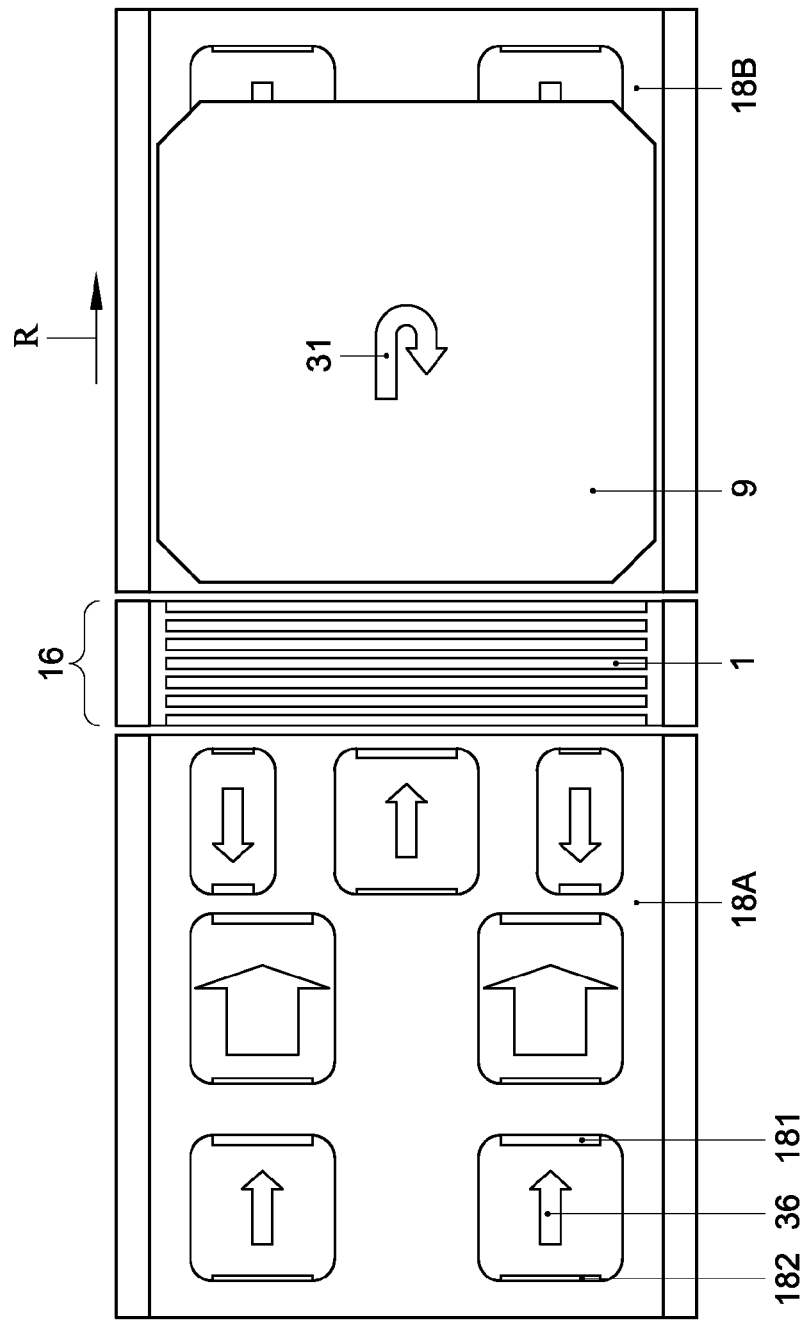
FIG. 7D shows the substrate at a moment of turning of direction of the substrate in a lead out zone.
Figure 7E:
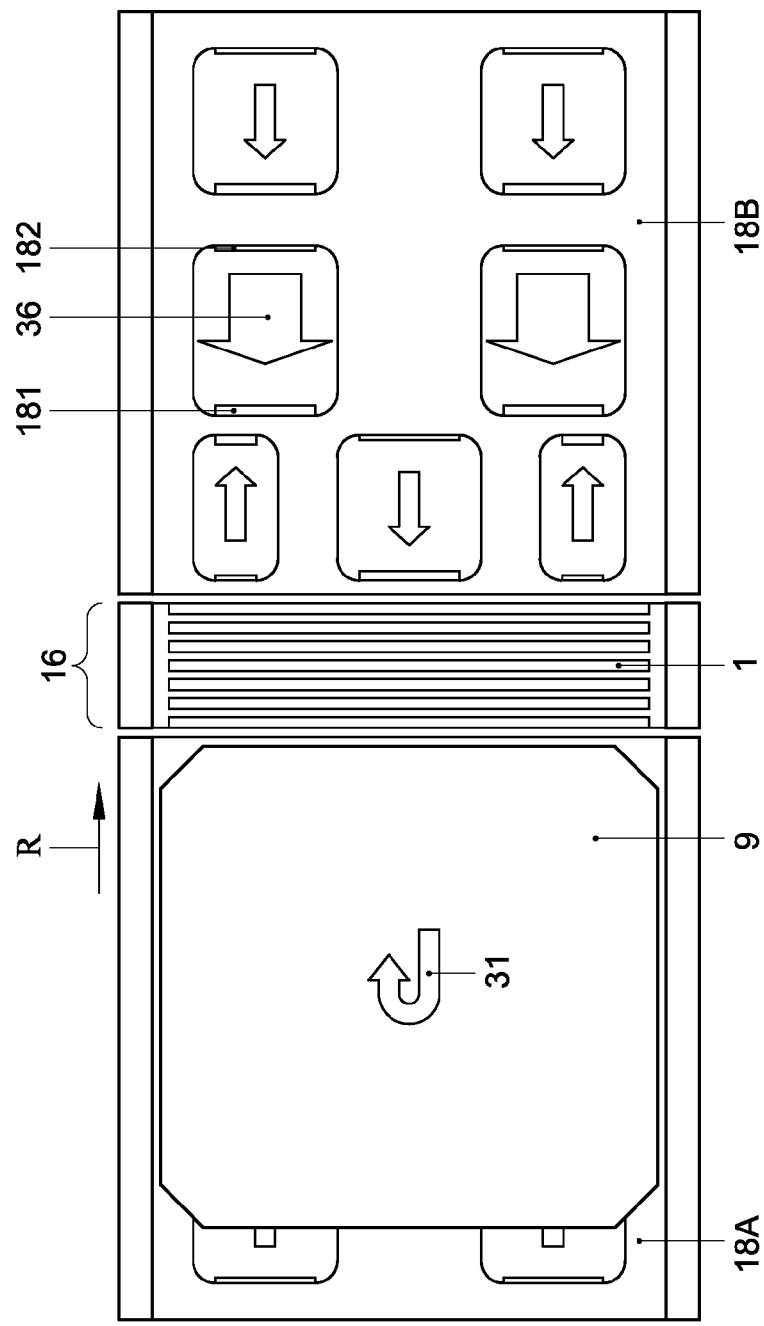
FIG. 7E shows the substrate at a subsequent moment of turning of direction in the lead in zone.
Figure 7F:
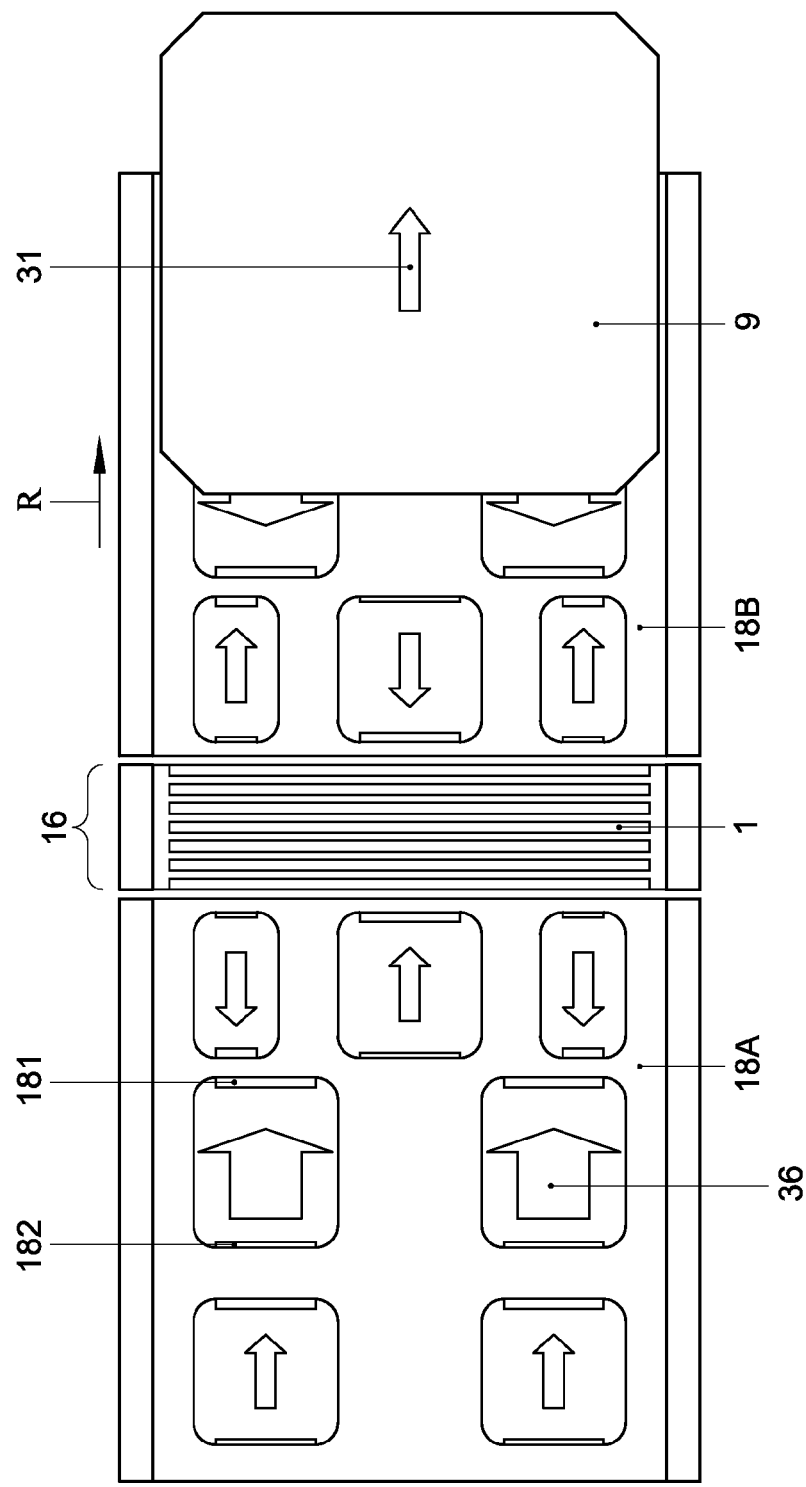
FIG. 7F shows the substrate being moved away from a second transport element.

FIG. 7A shows a top view of the first drive section 18A, the second drive section 18B, and the working zone 16 with the injector head 1. FIG. 7B shows the substrate 9 being transported in the lead in zone 15. FIG. 7C shows the substrate 9 being transported through the working zone 16. FIG. 7D shows the substrate 9 at a moment of turning of direction of the substrate 9 in the lead out zone 17. FIG. 7E shows the substrate 9 at a subsequent moment of turning of direction in the lead in zone 15. FIG. 7F shows the substrate 9 being moved away from the second transport element 18B. Thus, FIGS. 7B-7F show how the substrate 9 can be moved reciprocatingly between the lead in zone 15 and the lead out zone 17 through the working zone 16. In FIG. 7A-F, a direction of movement of the substrate 9 is indicated by arrow 31.

The conveying system may be provided with alternatingly arranged pairs of gas inlets 181 and gas outlets 182, comprised in drive pockets 34. On opposite sides of the working zone 16, transport elements 18A, 18B each provide an oriented gas flow towards the working zone. In this way, a reciprocating motion can be provided, typically, by suitably activating a gas flow in the transport elements 18A, 18B when the substrate is facing the respective element. To this end, a substrate position detector can be present detecting the position for example via optical, mechanical or pressure variation detection. A pocket may have a recess depth in a range of 50-500 micron, typically 100 micron. The conveying system may further comprise the gas flow control system arranged to provide a gas bearing pressure and a gas flow along the conveying plane, indicated by direction R. By controlling the gas flow, movement of the substrate 9 can be provided, typically, by providing position sensors to detect or measure a position, or presence, of the substrate relative to the drive sections 18A, 18B. Thus, a drag force provided by the gas flow on the substrate 9 may be employed for realising movement of the substrate 9.

In FIGS. 7A-F, the gas inlets 181 and gas outlets 182 are arranged for moving the substrate reciprocatingly between the lead in zone 15 and the lead out zone 17 through the working zone 16. Thereto each one of the first and second drive sections 18A, 18B may be provided with a plurality of drive pockets 34 of gas inlets 181 and a gas outlets 182. A pair of drive pockets arranged below and above a substrate to be transported functions as a gas bearing. Typically, additional non-driving gas bearings may be provided with no directional flow for transportation. If such gas bearing provide sufficient stiffness, pockets 34 may be provided non-symmetrically respective to the plane of substrate, or in particular, only on one side of the substrate. In a zone of drive section 18A, 18B away from the working zone 16, the drive pockets 34 are oriented towards the working zone to provide reciprocating movement through the working zone. In the zone of drive sections 18A, 18B adjacent the working zone alternatingly oriented pockets of different size are provided that sustain the substrate velocity. In particular, for a substrate exiting section 18A and enters section 18B, it will be sustained by a central larger pocket in section 18A oriented towards the working zone and two decentral smaller pockets in section 18B oriented away from the working zone 15 that are provided adjacent a larger central pocket in section 18B that is oriented towards the working zone 16. In use, the gas flow may, at least partly, be directed from the gas outlet 182 to the gas inlet 181. The gas flow occurs from the gas outlets 182 to the gas inlets 181. In this way, a direction of the gas flow may be defined, indicated by arrows 36 providing a directional air bearing— that is, an air bearing having a directional bearing force in the conveying plane that moves the substrate in the conveying plane. More in general, the gas outlets 182 may individually be provided with a restriction 185. Such a restriction 185 may enable improved control of gas supply from the gas outlets 182 to the gas inlets 181. E.g., a gas bearing provided by the gas flow from the gas outlets 182 to the gas inlets 181 may have an increased stiffness. E.g., the gas flow may be less sensitive to perturbations resulting from movement of the substrate 9. The restriction 185 defines the gas flow direction from the outlet 182 including the restriction 185 towards the inlet 181. Alternatively, an outlet 182 can be provided without restriction, which offers a possibility of reversing the gas flow 36 in the pocket. For this variant, additional—non directional—air bearings may be provided.

In each one of the first and second drive sections 18A, 18B, the direction 36 of the gas flow of at least a first one 34A of the plurality of drive pockets 34 having the gas inlets 181 and gas outlets 182 may be directed towards the working zone 16. Further, in each one of the first and second drive sections 18A, 18B, a direction of the gas flow of at least a second one 34B of the plurality of drive pockets 34 having the gas inlets 181 and gas outlets 182 is directed away from the working zone 16. Thus, in this variant, in the first drive section 18A and the second drive section 18B, the gas flow of the drive pockets 34A is directed towards the working zone 16 and the gas flows of the drive pockets 34B is directed away from the working zone. By having the opposing gas flow directions of pockets 34A, 34B, movement of the substrate away from the working zone is possible, as well as movement of the substrate towards the working zone. Such opposing directions of movement in the lead in zone 15 may be beneficial for enabling reciprocating motion of the substrate 9.

The second one of the drive pockets 34B may be located, in the first and second drive section 18A, 18B, in between the working zone 16 and the at least first one of the drive pockets 34A. Thus, in this variant, in the first drive section 18A and the second drive section 18B, the second ones 34B of the pockets may be located in between one of the first ones 34A of the pockets and the working zone 16. By such an arrangement, movement of the substrate through the working zone 16 can be promoted by means of the second ones 34B of the pockets, while, when it is detected (by position detectors (not indicated) that the substrate has substantially passed the working zone 16, the direction 31 of movement can be reversed by means of the first ones 34A of the pockets.

Alternatively, the gas flow may from the gas outlet 182 to the gas inlet 181 may be substantially continuous in time. Thus, the gas flow, e.g. the direction of the gas flow, from the gas outlet 182 to the gas inlet 181 may be substantially continuous in time during motion, e.g. during reciprocating motion, of the substrate.

A velocity and/or spatial extent of the gas flow of the at least first one 34A of the pockets 34 may be larger, in particular 1.5 times larger, than a velocity and/or spatial extent of the gas flow of the at least second one 34B of the pockets. The spatial extent of a pair of a gas inlet 181 and a gas outlet 182 of pocket 34 is indicated in FIG. 7A by dimensions $H_1$ and $H_2$. $H_2$ may be approximately equal to a distance between an inlet 181 and an outlet 182 of a pocket 34. $H_1$ may be approximately equal to a length of the inlet 181 and/or the outlet 182 of the pocket 34. The dimensions $H_1$ and $H_2$ may be determined along mutually transversely directed directions.

In the way described above with reference to FIG. 7A-F, the first transport element 18A and the second transport element 18B may be arranged for moving the substrate 9 reciprocatingly between the lead in zone 15 and the lead out zone 17 through the working zone 16.

Thus, in FIG. 3 and FIGS. 7A-F examples are provided of an aspect of the invention wherein the conveying system is provided with, preferably alternatingly, arranged gas inlets and outlets; comprising a gas flow control system arranged to provide a gas bearing pressure and a gas flow along the conveying plane, to provide movement of the substrate by controlling the gas flow. Preferably, in use the gas flow from a gas outlet to a gas inlet that may be dedicated to the gas outlet, e.g. may form a pair with the gas outlet, is directed along a path that is substantially parallel with the conveying plane. Preferably, in the lead in and lead out zone, transport elements are provided for providing a transport of the substrate along the conveying plane. Preferably, the transport elements comprise the gas inlets and outlets.

Furthermore, FIG. 3 and FIGS. 7A-F show examples of an embodiment of the invention, according to which the conveying system comprises a lead in zone, and a working zone adjacent the lead in zone and aligned relative to the conveying plane; wherein the injector head is provided in the working zone, and wherein a sheeted substrate can be inserted in the lead in zone; wherein a lead out zone is provided adjacent the working zone; wherein the gas inlets and outlets are arranged for moving the substrate reciprocatingly between the lead in zone and the lead out zone through the working zone. Reciprocating motion may offer the advantage of a more spatially limited apparatus for applying multiple layers, compared to apparatuses arranged for unidirectional motion. Preferably, a direction, a velocity and/or a spatial extent of a gas flow between the gas outlets and the gas inlets is arranged for enabling reciprocating motion of the substrate.

FIGS. 7A-F further illustrate, by way of example, an embodiment according to the invention wherein the gas inlets and outlets are arranged for moving the substrate reciprocatingly between the lead in zone and the lead out zone through the working zone by providing in the lead in zone a first transport element and in the lead out zone a second transport element. Preferably, each one of the first and second transport element being provided with a plurality pockets having gas inlets and gas outlets. Preferably, the gas control system is arranged for realising that, in each one of the first and second transport element, a direction of the gas flow of at least a first one of the pockets having the gas inlets and gas outlets is directed towards the working zone and a direction of the gas flow of at least a second one of the pockets having the gas inlets and gas outlets is directed away from the working zone.

In a further embodiment that may be applied more generally, in each one of the first and second transport element, the at least second one of the pockets having the gas inlets and gas outlets is located in between the working zone and the at least first one of the pockets having the gas inlets and gas outlets. Such an arrangement may be beneficial for sustaining motion of the substrate through the working zone by applying a force on a part of the substrate that has already passed the working zone by means of the at least second one of the pockets having the gas inlets and gas outlets. Such an arrangement may be beneficial for reversing and/or initiating motion of the substrate towards the working zone by means of the at least first one of the pockets having the gas inlets and gas outlets.

In a further embodiment that may be applied more generally, a velocity and/or spatial extent of the gas flow of the at least first one of the pockets having the gas inlets and gas outlets is larger, in particular 1.5 times larger, than a velocity and/or spatial extent of the gas flow of the at least second one of the pockets having the gas inlets and gas outlets. Experiments have shown that this may be beneficial proportions.

Figure 8A:
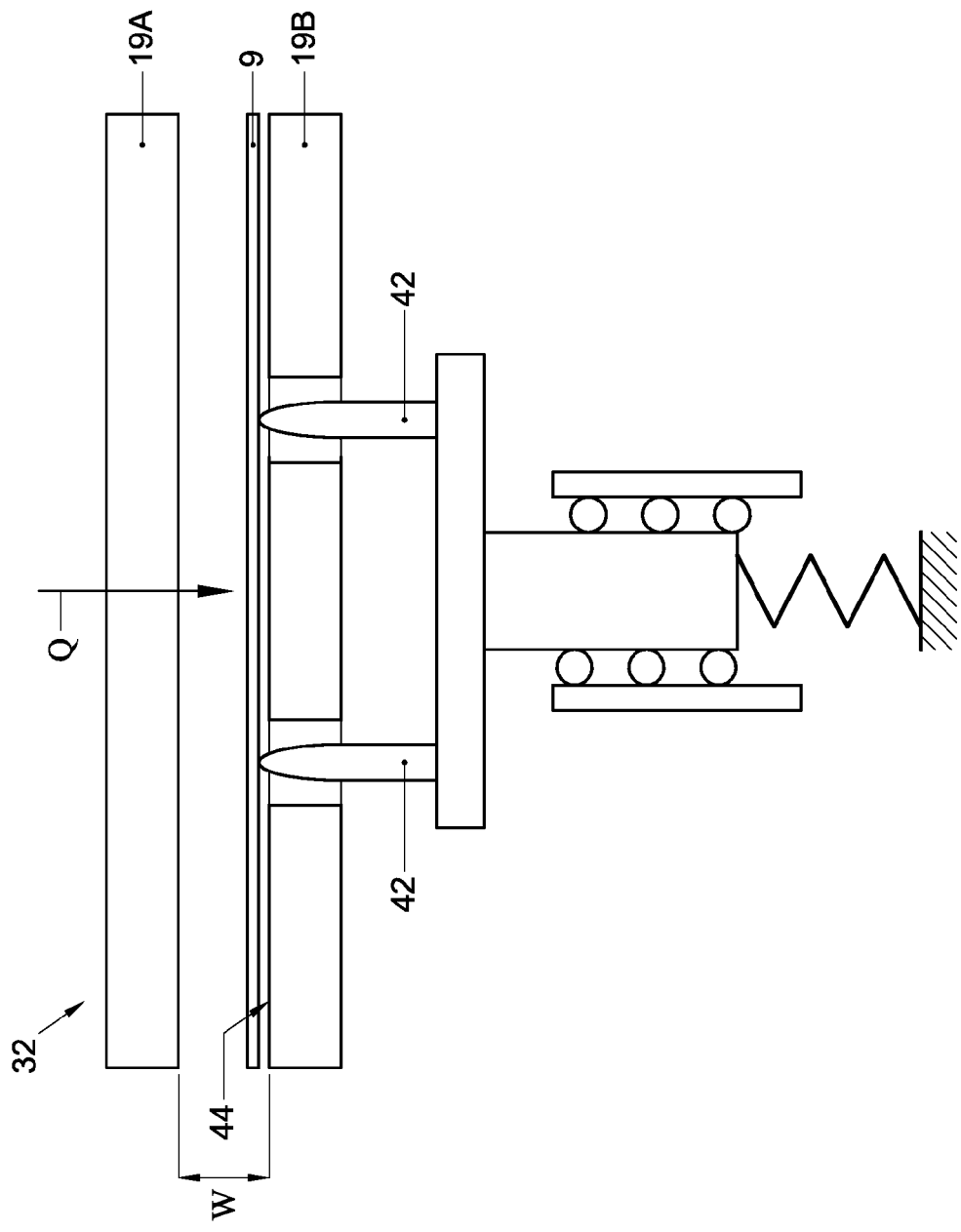
FIG. 8A shows a reception element with a wall part in an opened position.
Figure 8B:
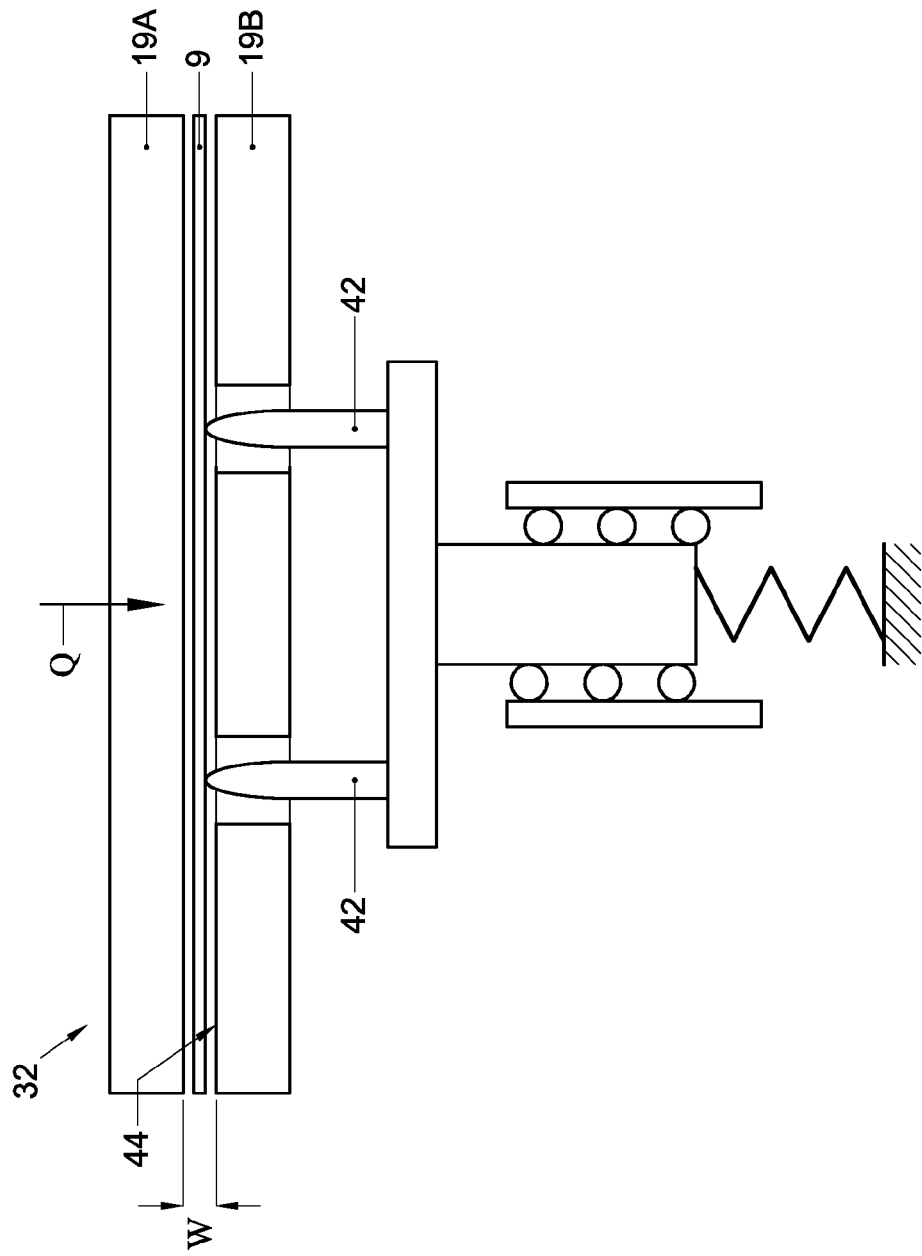
FIG. 8B shows a reception element with a wall part in an intermediate position.
Figure 8C:
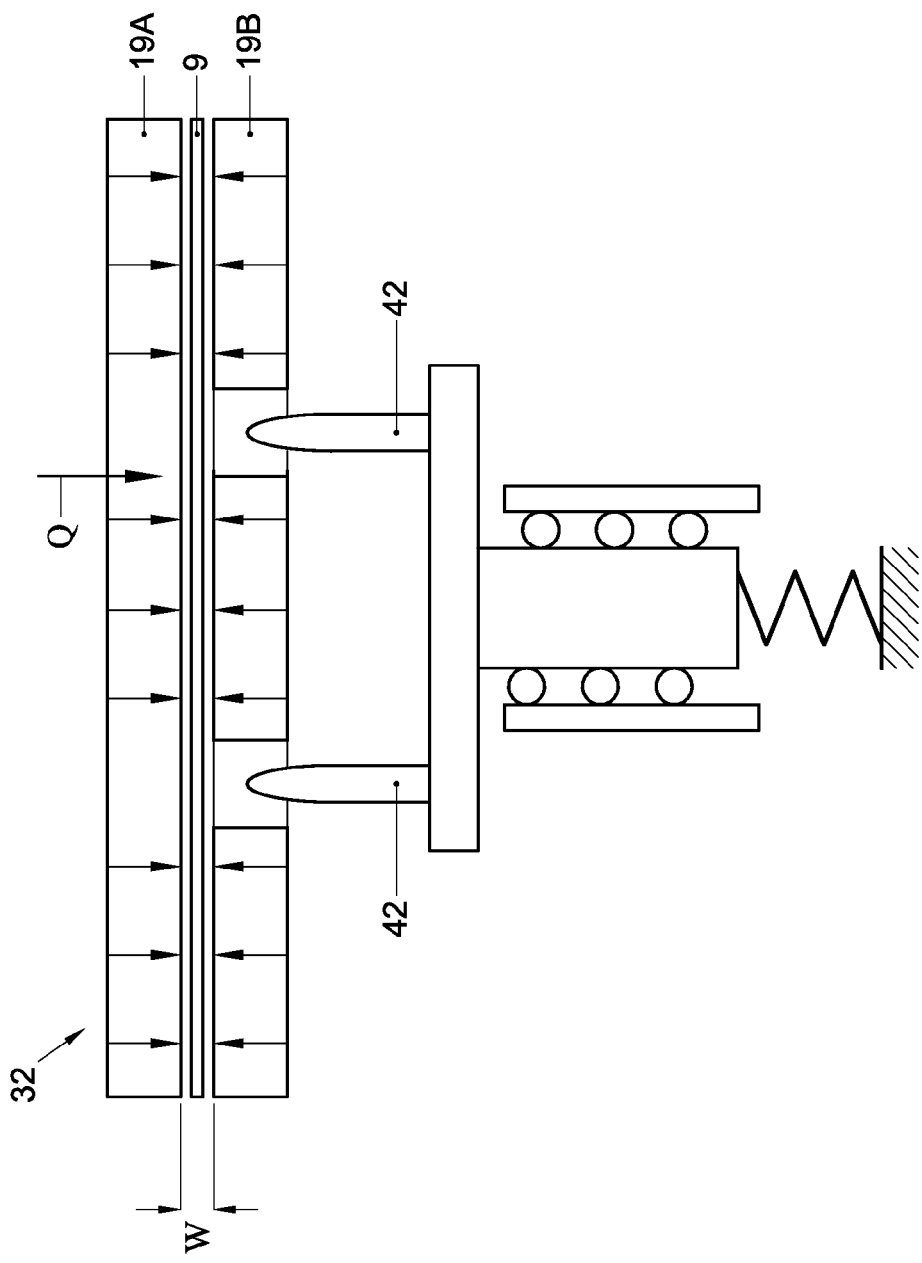
FIG. 8C shows a reception element with a wall part in a closed position.

A variant of the apparatus in the fifth embodiment is illustrated in FIGS. 8A-C. Here, a part of the lead in zone 15 wherein the substrate is introduced, further referenced as reception element, may have a top wall part 19 that is movable along direction Q normal to the conveying plane, to set a working height and or to facilitate introduction of the substrate into the injector head 1. In addition, the injector head 1 may be movable along direction P towards and away from the conveying plane to set a proper working height. This movement may be provided by cushioning effect of the air bearing, that is, the injector head may be held floating.

FIGS. 8A-C show the reception element 32 that is provided in the lead in zone 15, in a view along arrow 38 indicated in FIG. 6. The lead in zone 15, in this variant the reception element 32, has a wall part, in particular a top wall part 19A, that is movable along a direction normal to the conveying plane. A bottom wall part 40B may be stationary in use. Alternatively, the top wall part 19A may be stationary and the bottom wall part 19B may be moveable, or both wall parts 19A, 19B may be moveable. By means of the moveable top wall part 19A, introduction of the substrate 9 into the injector head 1 may be facilitated. Thus, in the variant of FIGS. 8A-C, the wall part 19A that is movable along the direction normal to the conveying plane is formed by the reception element 32, to facilitate introduction of the substrate 9 into the first transport element 18A.

The wall part, here the top wall part 19A, can be moved from an opened position via an intermediate position to a closed position. FIG. 8A shows the reception element 32 with the wall part in the opened position. FIG. 8B shows the reception element 32 with the wall part in the intermediate position. FIG. 8C shows the reception element 32 with the wall part in the closed position. In FIG. 8C, the substrate 9 may in use be floating in between the top wall part 19A and the bottom wall part 19B.

It may thus be clear that, by means of the reception element, an option is provided for the lead in zone to be constructed to reduce a working height, here the reception gap W, above the conveying plane in a direction towards the working zone. The conveying plane being in a direction towards the working zone is indicated e.g. by the direction R in FIG. 5.

The wall part defines a reception gap W in the direction normal to the conveying plane. It may be clear from FIGS. 8A-C that the reception gap W is reduced when the wall part is moved towards the closed position. In the opened position the reception gap W may be arranged for insertion of the substrate 9 into the apparatus. Thereto the reception gap may be larger than 3 mm, preferably larger than 7 mm, for example up to 20 mm. To prevent prevent contact of the substrate 9 and the bottom wall part 19B, moveable pins 42 may be provided in the apparatus for placing the substrate thereon.

In the intermediate position the reception gap W may be arranged for heating the substrate towards a working temperature. Thereto the reception gap may be in a range between a lower value of e.g. 0.2 mm and a higher value of e.g. 5 mm. The lower value of the reception gap W with the wall part in the intermediate position may promote that mechanical contact between the wafer 9 and the wall parts of the reception element 32 is prevented. Such mechanical contact may otherwise be caused by warping of the substrate as a result of mechanical stress induced during heating. The higher value of the reception gap W with the wall part in the intermediate position may promote a speed of heating. For example, heating the substrate 9 can be carried out by supplying heat towards the substrate 9 through the gap. Preferably, the pins 42 comprise a ceramic material. As a result, heat conduction through the pins 42 may be substantially decreased. This may increase a speed of heating the substrate 9 and may promote a uniform temperature distribution in the wafer 9.

In the closed position, the reception gap W may be equal to a gap in a remainder part of the lead in zone 15. The movable wall part may be coupled to the pins 42 so that the pins are move below a surface 44 of the bottom wall part 19B when the upper wall part 19A moves towards the closed position.

Thus, more in general, the reception gap W in the opened position may be substantially equal to the reception gap W in the intermediate position.

Thus, according to a further aspect of the invention of which an example is illustrated in FIGS. 8A-C, the conveying system comprises a lead in zone, and a working zone adjacent the lead in zone and aligned relative to the conveying plane; wherein the injector head is provided in the working zone, and wherein a sheeted substrate can be inserted in the lead in zone, wherein the lead in zone has a wall part, in particular a top wall part, that is movable along a direction normal to the conveying plane, to facilitate introduction of the substrate into the injector head. The wall part being moveable may enable increasing a gap between the top wall part and a bottom wall part. Then, insertion of the substrate may be facilitated. In particular, mechanical contact between the wall part and the substrate may be substantially prevented.

In an according to said further aspect, in the lead in zone a reception element and preferably a first transport element are provided, wherein the wall part that is movable along the direction normal to the conveying plane is formed by the reception element, to facilitate introduction of the substrate into the first transport element. Having a dedicated reception element in the lead in zone may enable improved conditions and/or constructions in another part of the lead in zone, e.g. in the first transport element.

In an embodiment according to said further aspect, the wall part can be moved from an opened position via an intermediate position to a closed position, wherein a reception gap in the direction normal to the conveying plane defined by the wall part is reduced when the wall part is moved towards the closed position, wherein in the opened position the reception gap is arranged for insertion of the substrate into the apparatus, in the intermediate position the reception gap is arranged for heating the substrate towards a working temperature, and/or in the closed position the reception gap is arranged for forming a gas-bearing between the substrate and the apparatus. Thus, improved reception may be performed. Process conditions for reception and heating more specifically, the heating speed to heat up the substrate, may be improved by adjusting the reception gap.

Figure 9A:
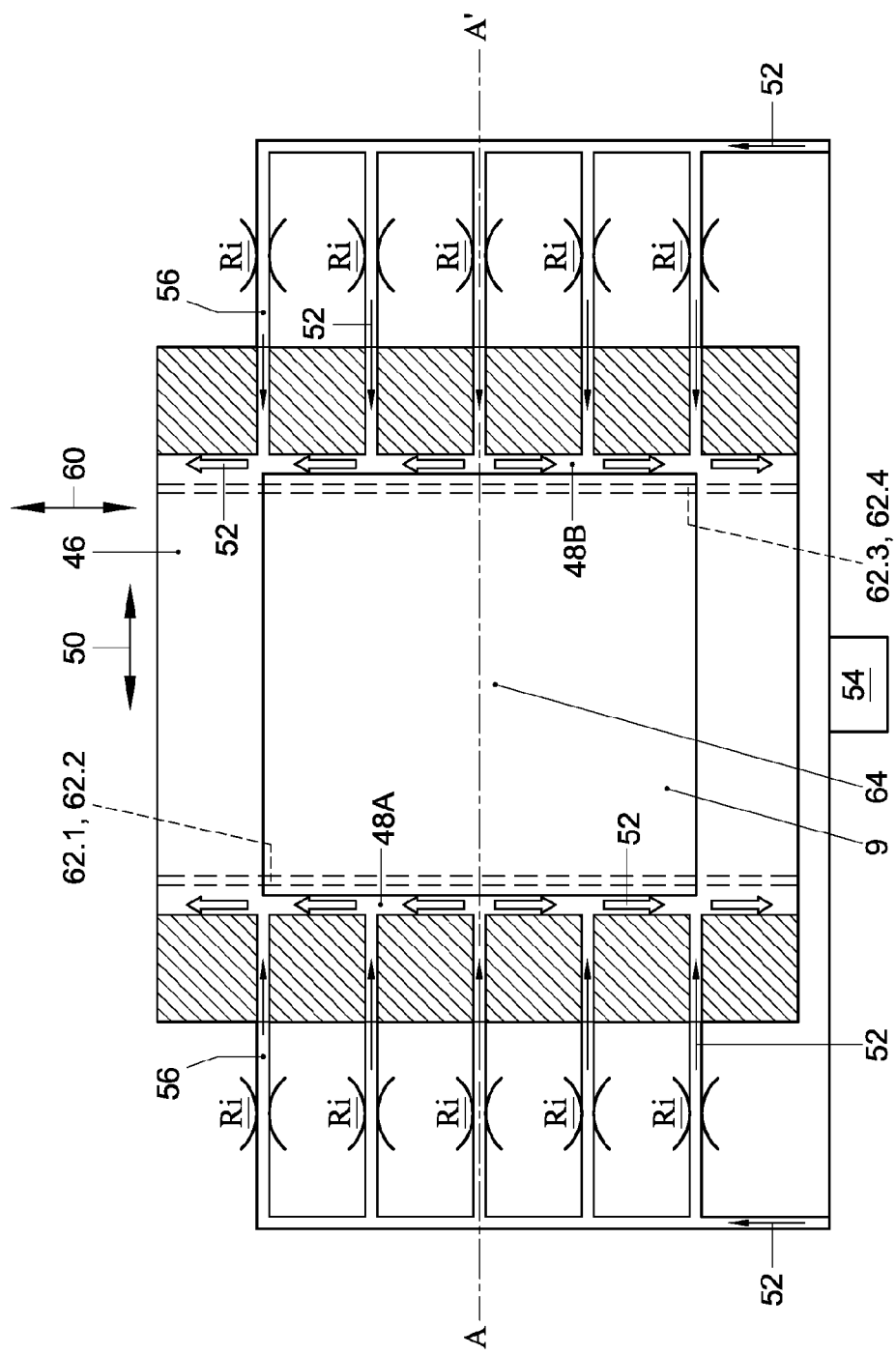
FIG. 9A shows a top view of a variant of an apparatus in a fifth embodiment.
Figure 9B:
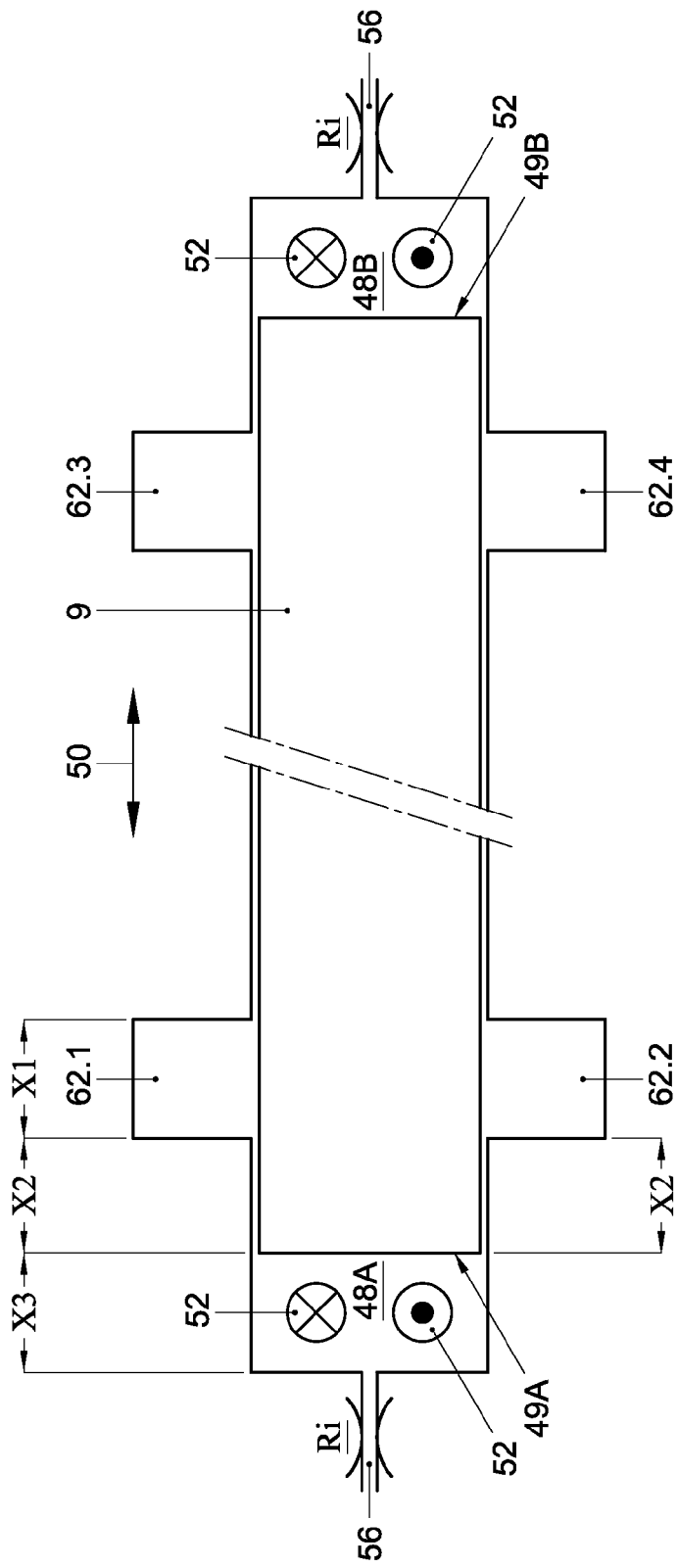
FIG. 9B shows a top view of a variant of the apparatus in the fifth embodiment.

FIGS. 9A and 9B show respectively a top view and a cross-sectional view of a variant of the apparatus in the fifth embodiment. FIGS. 9A and B show the substrate 9. The cross section shown in FIG. 9B is indicated by A-A' in FIG. 9A. FIG. 9A further shows an apparatus part 46 along the conveying plane. The apparatus part may e.g. be a part of the lead in zone 15, the lead out zone 17, and/or the working zone 16.

In this variant, the apparatus may be provided with a first centering air bearing 48A and a second centering air bearing 48B for centering the substrate 9 so as to move the substrate along a central line between the lead in zone 15 and lead out zone 17. Double arrow 50 illustrates centering movements transverse to a general direction relative movement of the substrate along the central line relative to the injector head 1 and in the plane of the substrate. Thus, by means of the first and/or second centering air bearing 48A, 48B, a force can be applied on a side surface, here respectively a first side surface 49A and/or a second side surface 49B, of the substrate 9 in the direction 50, i.c. along the conveying plane. More in general, an extent $X_3$ of the first air bearing 48A and/or the second air bearing 48B along a plane of the substrate 9 may, in use, be in a range from 0.1 mm to 1.5 mm, in particular in a range from 0.3 mm to 0.8 mm.

The apparatus may further be provided with centering-bearing gas supplies 56 that are provided along the conveying plane adjacent to, in use, the opposing side surfaces 49A, 49B of the substrate 9 along the direction of the relative movement, here indicated by double arrow 60, of the substrate 9 and the injector head 1. The supplies 56 may be individually provided with restrictions Ri. Such restriction may enable improved control of air supply to the first and/or second center air bearing 48A, 48B. The restrictions Ri may increase a stiffness of the first and/or second center air bearing 48A, 48B.

The apparatus may be provided with a centering bearing controller 54 for controlling a pressure in the first and second centering air bearing. Thereto the controller 54 may be connected to the centering-bearing gas supplies 56 for controlling an amount of gas that flows out of the centering-bearing gas supplies 56. Flow of bearing gas of the centering air bearings is indicated by arrows 52. FIGS. 9A and 9B further show examples of pressure-release notches 62.i (i=1,4). Here, the pressure-release notches 62.1, 62.2 individually extend along and adjacent to the first air bearing 48A. Here, the pressure-release notches 62.3, 62.4 individually extend along and adjacent to the second air bearing 48B. In FIG. 9A, the pressure-release notches 62.1, 62.2 are located in between the first air bearing 48A and the bearing pressure arrangement 64 in between the injector head 1 and the support part 10. In FIG. 9A, the pressure-release notches 62.3, 62.4 are individually located in between the second air bearing 48B and the bearing pressure arrangement 64 in between the injector head 1 and the support part 10. The pressure-release notches may thus be individually arranged in between the bearing pressure arrangement and the first or second centering air bearing 48A, 48B for substantially decoupling control of a pressure in the first and/or second centering air bearing 48A, 48B on the one hand, and a pressure in the bearing pressure arrangement on the other hand.

More in general, an individual width $X_1$ of the pressure-release notches in a direction parallel with the conveying plane may be in a range from 0.1 mm to 3 mm, in particular in a range from 0.3 mm to 2 mm. A distance $X_2$ from at least one of the pressure-release notches 62.i to the first or second air bearing 48A, 48B may be in a range from 0.1 mm to 1.5 mm, in particular in a range from 0.3 to 0.8 mm.

Thus, as illustrated in FIGS. 9A and 9B by way of example, an aspect of the invention may comprise that the apparatus is provided with a first centering air bearing and a second centering air bearing arranged on sides of lead in and lead out zones 15, 17, for centering the substrate so as to move the substrate along a central line between the lead in zone 15 and lead out zone 17. Experiments performed by the inventor have shown that, in this way, a beneficial centering of the substrate can be achieved. By means of the first and/or second centering air bearing, a force can be applied on a side surface of the substrate in a direction along the conveying plane. Preferably, the apparatus is provided with a centering bearing controller for controlling a pressure in the first and second centering air bearing. Preferably, the apparatus is provided with centering-bearing gas supplies that are provided along the conveying plane adjacent to, in use, opposing side surfaces of the substrate along the direction of the relative movement of the substrate and the injector head.

As is also illustrated in FIGS. 9A and 9B by way of example, said aspect of the invention may comprise that the apparatus is provided with pressure-release notches, preferably four pressure-release notches, that extend along and adjacent to the first or second centering air bearing, preferably individually being arranged in between on the one hand the first or second centering air bearing and on the other hand the bearing pressure arrangement in between the injector head and the support part, the notches optionally being mutually connected for in use substantially equalizing a pressure in the pressure-release notches. The pressure-release notches may be individually arranged in between the bearing pressure arrangement and the first or second centering air bearing for substantially decoupling control of a pressure in the first or second centering air bearing on the one hand, and a pressure in the bearing pressure arrangement on the other hand. Experiments performed by the inventor have shown that such notches may provide sufficient decoupling to enable substantial independent control of the centering.

FIG. 9C shows an alternative embodiment for a centering air bearing 560 with improved guidance. Alternative or additional to the notches 62.1-4 of FIG. 9b, gas supplies 561 with gas bearing restrictions Ri may be provided along the conveying plane on opposed sides of the substrate planar face and near, in use, the opposing side walls 91 of the substrate 9. That is, for a wafer of a typical width W of e.g. 150 mm, the supplies 561 may be provided in a range R of 1-6 mm away from a side wall 18.1 of the drive section 18 on opposed sides 91 of the substrate 9 transverse to the conveying direction x (transverse to the plane of paper).

The supplies 561 end in a recessed space 562 that extends over a distance D (see FIG. 9d) along the sides 91 of the substrate 9. The recessed space 562 defines a gap height g1 in the recess that is higher than a working gap height g2 between the opposed walls 18.2 of the drive section 18 and the substrate planar surface 92. This recessed space pressure configuration 560 provides gas bearing in the z direction normal to the plane of the substrate 9. The gap height g3 (typically 0.3-1 mm) of the recessed space 562 in the y direction transverse to the conveying direction x additionally provides a centering gas bearing so that the substrate 9 is centered along the conveying direction. In particular, in use, a first gap height g1 normal to the wafer surface of the recessed space 562 above the wafer surface 92 is less than a second gap height g3 normal to the sides 91 of the substrate 9.

Figure 9D:
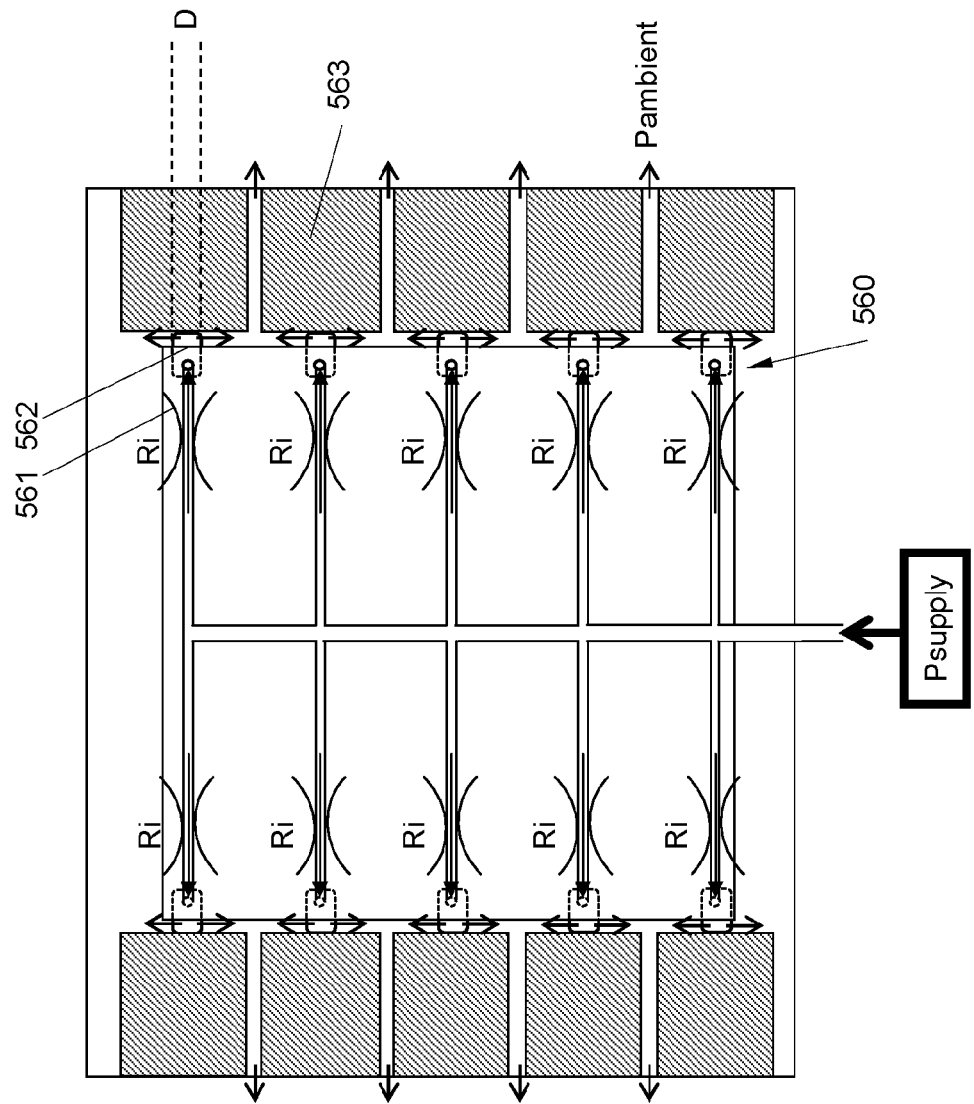
FIG. 9D shows a schematic top view of the pressure arrangement of FIG. 9C.

FIG. 9d shows a schematic top view of the pressure arrangement. On opposed top and bottom sides, central pressure feeds may be provided that end in respective supplies 561 with restrictions Ri. Alternatively plural pressure feeds may be provided. The recessed space 561 extends along a side of the substrate over a limited length so that the air pressure escapes in a flow path along the side of the substrate indicated by arrows 52 towards exhausts 563 distanced from the recessed spaces 562 via the flow paths. The exhaust 563 may end in ambient atmosphere.

Figure 9E:
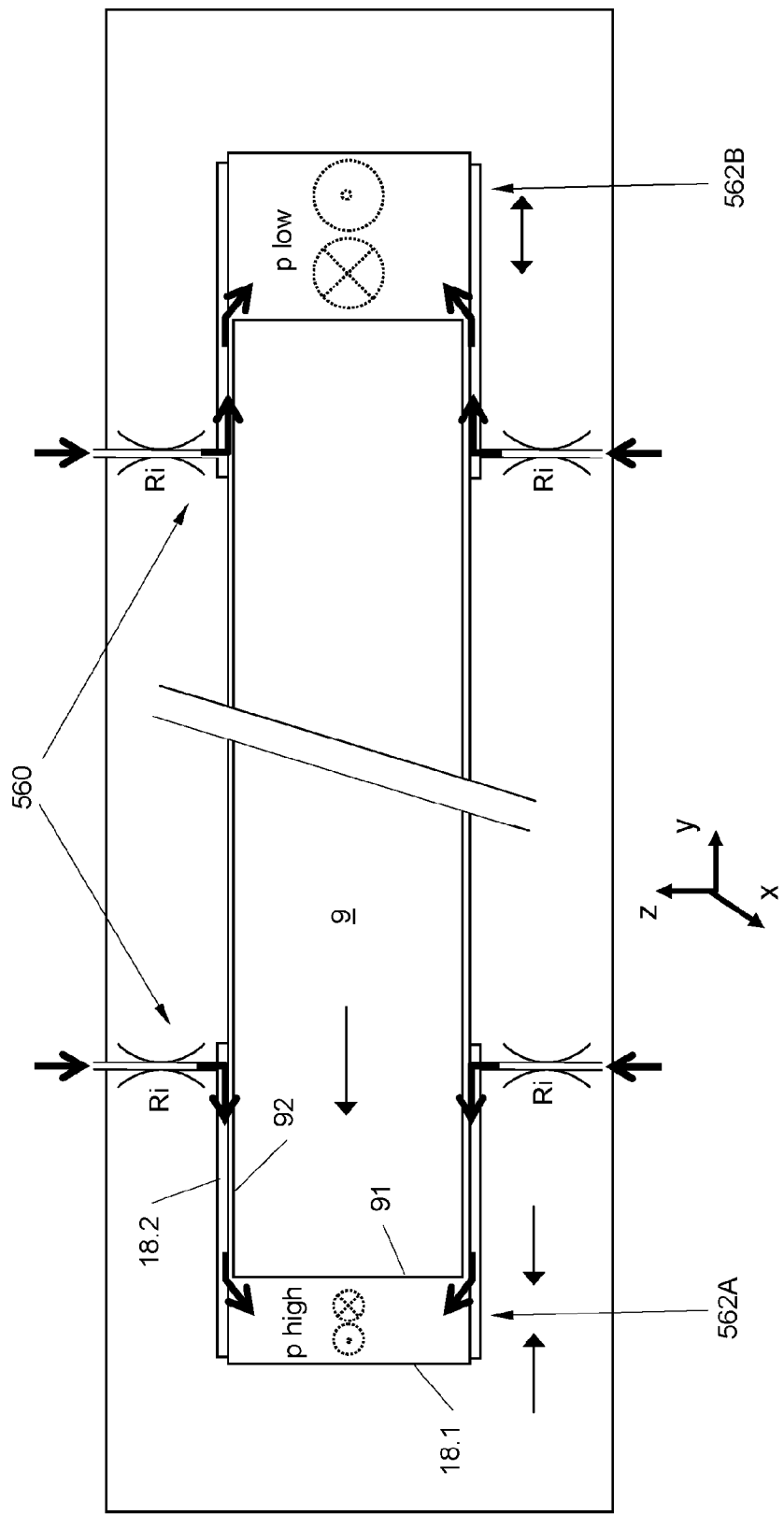
FIG. 9E shows a centering working principle of the centering air bearing arrangement of FIG. 9C.

FIG. 9e shows a centering working principle of the centering air bearing arrangement 560 of the embodiment of FIGS. 9c and 9d. It becomes clear that a deflection of substrate 9 towards a first side results in a higher counter pressure in the corresponding compressed recessed chamber 562A formed by substrate faces 91 and 92 and the drive section walls 18.1 and 18.2 that is thereby reduced in volume; whereas it results in a lower pressure on the opposed recessed chamber 562B that is increased in volume by sideways movement of the substrate 9 in the transverse direction y of the conveying direction x. In this schematic, further z-bearings may be present which are not depicted. By the z-bearing effect of the centering air bearing 960, the sideways centering bearing pressure can be substantially increased relative to the z-bearing pressure resulting in excellent centering stiffness, while suitably decoupled from any additional z-air bearings (not shown). Without this recessed chamber the sideways pressure should be limited because of possible undesired z-deflections due to the centering pressure. The remaining z-bearing can be substantially lowered at least relative to the sideways pressure. In addition, the flow of the centering pressure arrangement 560 from the supplies 561 towards the sides 91 of the wafer 9 results in more stable dynamic behaviour in contrast to flow directed normal to the substrate sides 91.

In an embodiment, the deposition space in use is motionless in the plane of the substrate surface while the substrate is in motion. In another embodiment, the deposition space in use is in motion in the plane of the substrate surface while the substrate is motionless. In yet another embodiment, both the deposition space and the substrate in use are in motion in the plane of the substrate surface.

The movement in the plane out of the substrate surface may help confining the injected precursor gas. The gas-bearing layer allows the injector head to approach the substrate surface and/or the substrate holder closely, for example within 50 micrometer or within 15 micrometer, for example in a range from 3 to 10 micrometer, for example 5 micrometer. Such a close approach of the injector head to the substrate surface and/or the substrate holder enables confinement of the precursor gas to the deposition space, as escape of the precursor gas out of the deposition space is difficult because of the close approach. The substrate surface in use bounding the deposition space may enable the close approach of the injector head to the substrate surface. Preferably, the substrate surface, in use, is free of mechanical contact with the injector head. Such contact could easily damage the substrate.

Optionally, the precursor supply forms the gas injector. However, in an embodiment, the gas injector is formed by a bearing-gas injector for creating the gas-bearing layer, the bearing-gas injector being separate from the precursor supply. Having such a separate injector for the bearing gas enables control of a pressure in the gas-bearing layer separate from other gas pressures, for example the precursor gas pressure in the deposition space. For example, in use the precursor gas pressure can be lower than the pressure in the gas-bearing layer. Optionally, the precursor gas pressure is below atmospheric pressure, for example in a range from 0.01 to 100 millibar, optionally in a range from 0.1 to 1 millibar. Numerical simulations performed by the inventors show that in the latter range, a fast deposition process may be obtained. A deposition time may typically be 10 microseconds for flat substrates and 20 milliseconds for trenched substrates, for example when chemical kinetics are relatively fast. The total gas pressure in the deposition space may typically be 10 millibar. The precursor gas pressure may be chosen based on properties of the precursor, for example a volatility of the precursor. The precursor gas pressure being below atmospheric pressure, especially in the range from 0.01 to 100 millibar, enables use of a wide range of precursors, especially precursors with a wide range of volatilities.

The gas-bearing layer in use typically shows a strong increase of the pressure in the gas-bearing layer as a result of the close approach of the injector head towards the substrate surface. For example, in use the pressure in the gas-bearing layer at least doubles, for example typically increases eight times, when the injector head moves two times closer to the substrate, for example from a position of 50 micrometer from the substrate surface to a position of 25 micrometer from the substrate surface, ceteris paribus. Preferably, a stiffness of the gas-bearing layer in use is between $10^3$ and $10^{10}$ Newton per meter, but can also be outside this range. Such elevated gas pressures may for example be in a range from 1.2 to 20 bar, in particular in a range from 3 to 8 bar. A stronger flow barrier in general leads to higher elevated pressures. An elevated precursor gas pressure increases a deposition speed of the precursor gas on the substrate surface. As deposition of the precursor gas often forms an important speed-limiting process step of atomic layer deposition, this embodiment allows increasing of the speed of atomic layer deposition. Speed of the process is important, for example in case the apparatus is used for building a structure that includes a plurality of atomic layers, which can occur often in practice. Increasing of the speed increases a maximum layer thickness of a structure that can be applied by atomic layer deposition in a cost-effective way, for example from 10 nanometer to values above 10 nanometer, for example in a range from 20 to 50 nanometer or even typically 1000 nanometer or more, which can be realistically feasible in several minutes or even seconds, depending on the number of process cycles. As non limiting indication, a production speed may be provided in the order of several nm/second. The apparatus will thus enable new applications of atomic layer deposition such as providing barrier layers in foil systems. One example can be a gas barrier layer for an organic led that is supported on a substrate. Thus, an organic led, which is known to be very sensitive to oxygen and water, may be manufactured by providing an ALD produced barrier layer according to the disclose method and system.

In an embodiment, the apparatus is arranged for applying a prestressing force on the injector head directed towards the substrate surface along direction P. The gas injector may be arranged for counteracting the prestressing force by controlling the pressure in the gas-bearing layer. In use, the prestressing force increases a stiffness of the gas-bearing layer. Such an increased stiffness reduces unwanted movement out of the plane of the substrate surface. As a result, the injector head can be operated more closely to the substrate surface, without touching the substrate surface.

Alternatively or additionally, the prestressing force may be formed magnetically, and/or gravitationally by adding a weight to the injector head for creating the prestressing force. Alternatively or additionally, the prestressing force may be formed by a spring or another elastic element.

In an embodiment, the precursor supply is arranged for flow of the precursor gas in a direction transverse to a longitudinal direction of the deposition space. In an embodiment, the precursor supply is formed by at least one precursor supply slit, wherein the longitudinal direction of the deposition space is directed along the at least one precursor supply slit. Preferably, the injector head is arranged for flow of the precursor gas in a direction transverse to a longitudinal direction of the at least one precursor supply slit. This enables a concentration of the precursor gas to be substantially constant along the supply slit, as no concentration gradient can be established as a result of adhesion of the precursor gas to the substrate surface. The concentration of the precursor gas is preferably chosen slightly above a minimum concentration needed for atomic layer deposition. This adds to efficient use of the precursor gas. Preferably, the relative motion between the deposition space and the substrate in the plane of the substrate surface, is transverse to the longitudinal direction of the at least one precursor supply slit. Accordingly, the precursor drain is provided adjacent the precursor supply, to define a precursor gas flow that is aligned with a conveying direction of the substrate.

In an embodiment, the gas-bearing layer forms the confining structure, in particular the flow barrier. In this embodiment, an outer flow path may at least partly lead through the gas-bearing layer. As the gas-bearing layer forms a rather effective version of the confining structure and/or the flow barrier, loss of the precursor gas via the outer flow path may be prevented.

In an embodiment, the flow barrier is formed by a confining gas curtain and/or a confining gas pressure in the outer flow path. These form reliable and versatile options for forming the flow barrier. Gas that forms the confining gas curtain and/or pressure may as well form at least part of the gas-bearing layer. Alternatively or additionally, the flow barrier is formed by a fluidic structure that is attached to the injector head. Preferably, such a fluidic structure is made of a fluid that can sustain temperatures up to one of 80° C., 200° C., 400° C., and 600° C. Such fluids as such are known to the skilled person.

In an embodiment, the flow barrier is formed by a flow gap between the injector head and the substrate surface and/or between the injector head and a surface that extends from the substrate surface in the plane of the substrate surface, wherein a thickness and length of the flow gap along the outer flow path are adapted for substantially impeding the volumetric flow rate of the precursor gas along the outer flow path compared to the volumetric flow rate of the injected precursor gas. Preferably, such a flow gap at the same time forms, at least part of, the outer flow path. Preferably, a thickness of the flow gap is determined by the gas-bearing layer. Although in this embodiment a small amount of the precursor gas may flow out of the deposition space along the outer flow path, it enables a rather uncomplicated yet effective option for forming the flow barrier.

In an embodiment, the deposition space has an elongated shape in the plane of the substrate surface. A dimension of the deposition space transverse to the substrate surface may be significantly, for example at least 5 times or at least 50 times, smaller than one or more dimensions of the deposition space in the plane of the substrate surface. The elongated shape can be planar or curved. Such an elongated shape diminishes a volume of the precursor gas that needs to be injected in the deposition space, thus enhancing the efficiency of the injected gas. It also enables a shorter time for filling and emptying the deposition space, thus increasing the speed of the overall atomic layer deposition process.

In an embodiment, the deposition space of the apparatus is formed by a deposition gap between the substrate surface and the injector head, preferably having a minimum thickness smaller than 50 micrometer, more preferably smaller than 15 micrometer, for example around 3 micrometer. The flow gap may have similar dimensions. A deposition space having a minimum thickness smaller than 50 micrometer enables a rather narrow gap leading to a rather efficient use of the precursor gas, while at the same time avoiding imposing stringent conditions on deviations in a plane out of the substrate surface of the positioning system that establishes the relative motion between the deposition space and the substrate in the plane of the substrate surface. In this way the positioning system can be less costly. A minimum thickness of the deposition gap smaller than 15 micrometer may further enhance efficient use of the precursor gas.

The gas-bearing layer enables the flow gap and/or the deposition gap to be relatively small, for example having its minimum thickness smaller than 50 micrometer or smaller than 15 micrometer, for example around 10 micrometer, or even close to 3 micrometer.

In an embodiment, the injector head further comprises a precursor drain and is arranged for injecting the precursor gas from the precursor supply via the deposition space to the precursor drain. The presence of the precursor drain offers the possibility of continuous flow through the deposition space. In continuous flow, high-speed valves for regulating flow of the precursor gas may be omitted. Preferably, a distance from the precursor drain to the precursor supply is fixed during use of the apparatus. Preferably, in use the precursor drain and the precursor supply are both facing the substrate surface. The precursor drain and/or the precursor supply may be formed by respectively a precursor drain opening and/or a precursor supply opening.

In an embodiment, the precursor drain is formed by at least one precursor drain slit. The at least one precursor drain slit and/or the at least one precursor supply slit may comprise a plurality of openings, or may comprise at least one slot. Using slits enables efficient atomic layer deposition on a relatively large substrate surface, or simultaneous atomic layer deposition on a plurality of substrates, thus increasing productivity of the apparatus. Preferably, a distance from the at least one precursor drain slit to the at least one precursor supply slit is significantly smaller, for example more than five times smaller, than a length of the precursor supply slit and/or the precursor drain slit. This helps the concentration of the precursor gas to be substantially constant along the deposition space.

In an embodiment, the apparatus is arranged for relative motion between the deposition space and the substrate in the plane of the substrate surface, by including a reel-to-reel system arranged for moving the substrate in the plane of the substrate surface. This embodiment does justice to a general advantage of the apparatus, being that a closed housing around the injector head for creating vacuum therein, and optionally also a load lock for entering the substrate into the closed housing without breaking the vacuum therein, may be omitted. The reel-to-reel system preferably forms the positioning system.

According to an aspect, the invention provides a linear system wherein the substrate carrier is conveniently provided by air bearings. This provides an easy and predictable substrate movement which can be scaled and continuously operated.

The precursor gas can for example contain Hafnium Chloride ($HfCl_4$), but can also contain another type of precursor material, for example Tetrakis-(Ethyl-Methyl-Amino) Hafnium or trimethylaluminium ($Al(CH_3)_3$). The precursor gas can be injected together with a carrier gas, such as nitrogen gas or argon gas. A concentration of the precursor gas in the carrier gas may typically be in a range from 0.01 to 1 volume %. In use, a precursor gas pressure in the deposition space 2 may typically be in a range from 0.1 to 1 millibar, but can also be near atmospheric pressure, or even be significantly above atmospheric pressure. The injector head may be provided with a heater for establishing an elevated temperature in the deposition space 2, for example in a range between 130 and 330° C.

In use, a typical value of the volumetric flow rate of the precursor gas along the outer flow path may be in a range from 500 to 3000 sccm (standard cubic centimeters per minute).

In general, the apparatus may be arranged for providing at least one of a reactant gas, a plasma, laser-generated radiation, and ultraviolet radiation, in a reaction space for reacting the precursor after deposition of the precursor gas on at least part of the substrate surface 4. In this way for example plasma-enhanced atomic laser deposition may be enabled, which may be favourable for processing at low temperatures, typically lower than 130° C. to facilitate ALD processes on plastics, for example, for applications of flexible electronics such as OLEDs on flexible foils etc, or processing of any other materials sensitive to higher temperatures (typically, higher than 130°). Plasma-enhanced atomic layer deposition is for example suitable for deposition of low-k Aluminum Oxide ($Al_2O_3$) layers of high quality, for example for manufacturing semiconductor products such as chips and solar cells. The reactant gas contains for example an oxidizer gas such as Oxygen ($O_2$), ozone ($O_3$), and/or water ($H_2O$).

In an example of a process of atomic layer deposition, various stages can be identified. In a first stage, the substrate surface is exposed to the precursor gas, for example Hafnium Tetra Chloride. Deposition of the precursor gas is usually stopped if the substrate surface 4 is fully occupied by precursor gas molecules. In a second stage, the deposition space 2 is purged using a purge gas, and/or by exhausting the deposition space 2 by using vacuum. In this way, excess precursor molecules can be removed. The purge gas is preferably inert with respect to the precursor gas. In a third stage, the precursor molecules are exposed to the reactant gas, for example an oxidant, for example water vapour ($H_2O$). By reaction of the reactant with the deposited precursor molecules, the atomic layer is formed, for example Hafnium Oxide ($HfO_2$). This material can be used as gate oxide in a new generation of transistors. In a fourth stage, the reaction space is purged in order to remove excess reactant molecules.

Although it may not be explicitly indicated, any apparatus according one embodiment may have features of the apparatus in another embodiment.

Optional aspects of the invention may comprise: Apparatus for atomic layer deposition on a surface of a sheeted substrate, comprising:—an injector head comprising•a deposition space provided with a precursor supply and a precursor drain; said supply and drain arranged for providing a precursor gas flow from the precursor supply via the deposition space to the precursor drain; the deposition space in use being bounded by the injector head and the substrate surface;•a gas bearing comprising a bearing gas injector arranged for injecting a bearing gas between the injector head and the substrate surface, the bearing gas thus forming a gas-bearing;—a conveying system providing relative movement of the substrate and the injector head along a plane of the substrate to form a conveying plane along which the substrate is conveyed; and a support part arranged opposite the injector head, the support part constructed to provide a gas bearing pressure arrangement that balances the injector head gas-bearing in the conveying plane, so that the substrate is held supportless by said gas bearing pressure arrangement in between the injector head and the support part; an apparatus wherein the deposition space is formed by a cavity, preferably having a depth D2-D1, in which the supply and drain end and/or begin; an apparatus wherein the gas bearing is formed, seen in a direction normal to the substrate surface as undulated shapes to prevent first order bending modes of the sheet substrate; an apparatus wherein the conveying system comprises a lead in zone, and a working zone adjacent the lead in zone and aligned relative to the conveying plane; wherein the injector head is provided in the working zone, and wherein a sheeted substrate can be inserted in the lead in zone, the lead in zone constructed to reduce a working height above the conveying plane, optionally in a direction towards the working zone; an apparatus wherein the lead in zone comprises a slanted wall part facing the conveying plane; an apparatus wherein the lead in zone has a wall part, in particular a top wall part, that is movable to set a working height; an apparatus further comprising a lead out zone; an apparatus, wherein the injector head is movable towards and away from the conveying plane; a method for atomic layer deposition on a surface of a substrate using an apparatus including an injector head, the injector head comprising a deposition space provided with a precursor supply and a gas bearing provided with a bearing gas injector, comprising the steps of: a) supplying a precursor gas from the precursor supply into the deposition space for contacting the substrate surface; b) injecting a bearing gas between the injector head and the substrate surface, the bearing gas thus forming a gas-bearing; c) establishing relative motion between the deposition space and the substrate in a plane of the substrate surface; and d) providing a gas bearing pressure arrangement that balances the injector head gas-bearing in the conveying plane, so that the substrate is held supportless by said gas bearing pressure arrangement in between the injector head and the support part; a method wherein the apparatus comprises a reaction space, comprising the step of: providing at least one of a reactant gas, a plasma, laser-generated radiation, and ultraviolet radiation, in the reaction space for reacting the precursor with the reactant gas after deposition of the precursor gas on at least part of the substrate surface in order to obtain the atomic layer on the at least part of the substrate surface; and/or a method further comprising:—providing a gas flow arranged to provide a gas bearing pressure and a gas flow along the conveying plane, to provide selective movement of the substrate relative to control of the gas flow system; and—switching the gas flow dependent on the presence of a substrate, so that, when a substrate edge passes a drain, the drain is switched off so to provide a flow away from the substrate.

The invention is not limited to any embodiment herein described and, within the purview of the skilled person, modifications are possible which may be considered within the scope of the appended claims. For example, the invention also relates to a plurality of apparatuses and methods for atomic layer deposition using a plurality of apparatuses.

While a number of embodiments show that the deposition space defines a deposition space height D2 relative to the substrate surface; and the gas bearing defines, relative to the substrate, a gap distance D1 which is smaller than the deposition space height D2, for the purpose of carrying out the invention, the skilled person will understand that the exact relative dimensions of the gas bearing gap and deposition spaces are not important. The invention can be carried out for any suitable injector heads, with a conveying system adjacent to it that has a centering air bearing as presently disclosed. In particular such a bearing is formed by a recessed space (562) extending along the substrate's planar face (91) towards and beyond the sides (91) of the substrate (9), to provide a bearing gas flow towards the substrate side face (92), so that, in use a bearing pressure is provided against a side face of the substrate so as to center the substrate along the conveying direction.

FIG. 10 shows a schematic view of a plurality of apparatuses 72.i.j (i=1, ... N) and (j=1, ..., M). In this example, N equals 5 and j equals 3. However, in other example N can be smaller or later than 5 and/or M can be smaller or larger than 3. Apparatuses may be serially combined. E.g., apparatuses 72.1.1, 72.1.2, and 72.1.3 are serially combined. Apparatuses that are serially combined may be used for deposition one or more ALD-layers on one and the same substrate 9. It may be clear from FIG. 10 that apparatuses may also be combined in parallel. E.g., apparatuses 72.1.1, 72.2.1, 72.3.1, 72.4.1, and 72.5.1 are combined in parallel in FIG. 10. Equally all kinematic inversions are considered inherently disclosed and to be within the scope of the present invention. The use of expressions like: "preferably", "in particular", "typically", etc. is not intended to limit the invention. The indefinite article "a" or "an" does not exclude a plurality. For example, an apparatus in an embodiment according to the invention may be provided with a plurality of the injector heads. It may further be clear that the terms 'relative motion' and 'relative movement' are used interchangeably. Aspects of disclosed embodiment may be suitably combined with other embodiments and are deemed disclosed. Features which are not specifically or explicitly described or claimed may be additionally included in the structure according to the present invention without deviating from its scope.

The invention claimed is:

1. Apparatus for atomic layer deposition on a surface of a sheeted substrate, the substrate comprising planar faces at least one of which forming the substrate surface, and side faces, the apparatus comprising: an injector head comprising a deposition space provided with a precursor supply and a precursor drain; said supply and drain arranged for providing a precursor gas flow from the precursor supply via the deposition space to the precursor drain; the deposition space in use being bounded by the injector head and the substrate surface;

a gas bearing comprising a bearing gas injector arranged for injecting a bearing gas between the injector head and the substrate surface, the bearing gas thus forming a gas-bearing;

a support part arranged opposite the injector head, the support part constructed to provide a gas bearing pressure arrangement that counters the injector head gas-bearing pressure in a conveying plane, so that the substrate is balanced supportless by said gas bearing pressure arrangement in between the injector head and the support part; and a conveying system comprising a drive section;

the drive section comprising transport elements arranged to provide relative movement of the substrate and the injector head along a plane parallel to the substrate surface to form said conveying plane along which the substrate is conveyed towards the injector head in a conveying direction; and a centering air bearing comprising centering-bearing gas supplies that are provided sideways to the drive section along the conveying direction, the supplies, in use, arranged opposite the planar faces of the substrate, and each ending in a recessed space extending along the respective planar faces towards a sides of the drive section, to provide a bearing gas flow towards the substrate side faces, so that, in use a bearing pressure is provided against at least one side face of the substrate so as to center the substrate along the conveying direction.

2. Apparatus according to claim 1, wherein the precursor drain is provided adjacent the precursor supply, to define a precursor gas flow that is aligned with the conveying direction of the substrate; and/or wherein, in use, the precursor drain and the precursor supply are both facing the substrate surface.

3. Apparatus according to claim 1, wherein the injector head comprises pressure control for switching any of the precursor supply; drain and/or the gas injector dependent on the presence of a substrate.

4. Apparatus according to claim 3, wherein the support part comprises a drain opposite a precursor drain, said drain being switchable dependent on the presence of a substrate in the deposition space, so that, when a substrate edge passes the precursor drain, a precursor flow is provided away from the substrate surface facing the support part.

5. Apparatus according to claim 1, wherein the injector head comprises a further deposition space provided with a reactant supply, the further deposition space in use being bounded by a flow barrier, wherein the apparatus preferably is arranged for providing at least one of a reactant gas, a plasma, laser- generated radiation, and ultraviolet radiation, in the further deposition space for reacting the precursor after deposition of the precursor gas on at least part of the substrate surface.

6. Apparatus according to claim 1, wherein the conveying system comprises a lead in zone; and a working zone adjacent the lead in zone and aligned relative to the conveying plane; wherein the injector head is provided in the working zone, and wherein the sheeted substrate can be inserted in the lead in zone.

7. Apparatus according to claim 6, wherein the recessed space extends along a side of the substrate over a limited length so that the air flow escapes via a flow path along the side of the substrate towards exhausts distanced from the recessed space.

8. Apparatus according to claim 1, wherein the recessed space defines a gap height in the recess that is higher than a working gap height between opposed walls of the drive section and the substrate planar surface to provide gas bearing in the direction normal to the plane of the substrate; and further defining a gap height in the direction transverse to the conveying direction providing the centering gas bearing so that the substrate is centered along the conveying direction.

9. Apparatus according to claim 1, wherein the conveying system comprises transport elements provided with alternatingly arranged pairs of gas inlets and outlets;
   comprising a gas flow control system arranged to provide a gas bearing pressure and a gas flow along the conveying plane, to provide movement of the substrate by controlling the gas flow.

10. Apparatus according to claim 9, wherein the pairs of gas outlets and inlets are provided in pockets facing the conveying plane for providing a flow, in the pocket, along the conveying plane from an outlet to an inlet; and wherein the gas outlets are provided with a flow restrictor to provide a directional air bearing.

11. Apparatus according to claim 1, provided with a first entering air bearing and a second centering air bearing for centering the substrate so as to move the substrate along a central line between the lead in zone and lead out zone.

* * * * *